United States Patent
Lane et al.

(10) Patent No.: US 8,076,756 B2
(45) Date of Patent: Dec. 13, 2011

(54) STRUCTURE FOR INHIBITING BACK END OF LINE DAMAGE FROM DICING AND CHIP PACKAGING INTERACTION FAILURES

(75) Inventors: Michael W. Lane, Cortlandt Manor, NY (US); Xiao Hu Liu, Briarcliff Manor, NY (US); Thomas M. Shaw, Peekskill, NY (US); Mukta G. Farooq, Hopewell Junction, NY (US); Robert Hannon, Wappingers Falls, NY (US); Ian D. W. Melville, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/031,195

(22) Filed: Feb. 19, 2011

(65) Prior Publication Data

US 2011/0140245 A1    Jun. 16, 2011

Related U.S. Application Data

(62) Division of application No. 11/746,684, filed on May 10, 2007, now Pat. No. 7,955,955.

(51) Int. Cl.
*H01L 23/544* (2006.01)
(52) U.S. Cl. .................... 257/620; 438/33; 438/465
(58) Field of Classification Search ............... 257/620; 438/33, 465
See application file for complete search history.

(56) References Cited

U.S. PATENT DOCUMENTS

| | | | |
|---|---|---|---|
| 5,024,970 A | 6/1991 | Mori | |
| 5,530,280 A | 6/1996 | White | |
| 5,665,655 A | 9/1997 | White | |
| 6,245,595 B1 | 6/2001 | Nguyen et al. | |
| 6,492,247 B1 | 12/2002 | Guthrie et al. | |
| 6,566,612 B2 | 5/2003 | Brouillette et al. | |
| 6,822,315 B2 | 11/2004 | Kelkar et al. | |
| 7,098,676 B2 | 8/2006 | Landers et al. | |
| 7,109,093 B2 | 9/2006 | Fitzsimmons et al. | |
| 7,112,470 B2 | 9/2006 | Daubenspeck et al. | |
| 7,382,038 B2 * | 6/2008 | Wu | 257/620 |
| 7,566,634 B2 | 7/2009 | Beyne | |
| 2004/0129938 A1 | 7/2004 | Landers et al. | |
| 2005/0208781 A1 | 9/2005 | Fitzsimmons et al. | |
| 2006/0057822 A1 | 3/2006 | Daubenspeck et al. | |
| 2006/0068567 A1 | 3/2006 | Beyne | |
| 2006/0125119 A1 | 6/2006 | Xiao et al. | |
| 2006/0278957 A1 | 12/2006 | Lin | |
| 2008/0070380 A1 | 3/2008 | Kusunoki | |
| 2008/0197438 A1 * | 8/2008 | Chan et al. | 257/434 |

FOREIGN PATENT DOCUMENTS

JP    2004111946 A    8/2004
JP    2005109322 A    4/2005

* cited by examiner

*Primary Examiner* — Thanh V Pham
(74) *Attorney, Agent, or Firm* — Graham S. Jones, II; Louis J. Percello; Robert M. Trepp

(57) ABSTRACT

A semiconductor product comprises a semiconductor substrate having a top surface and a bottom surface including a semiconductor chip. The semiconductor substrate has a top surface and a perimeter. A barrier is formed in the chip within the perimeter. An Ultra Deep Isolation Trench (UDIT) is cut in the top surface of the chip extending down therein between the perimeter and the barrier. A ILD structure with low-k pSICOH dielectric and hard mask layers is formed over the substrate prior to forming the barrier and the UDIT. The ILD structure interconnection structures can be recessed down to the substrate aside from the UDIT.

20 Claims, 20 Drawing Sheets

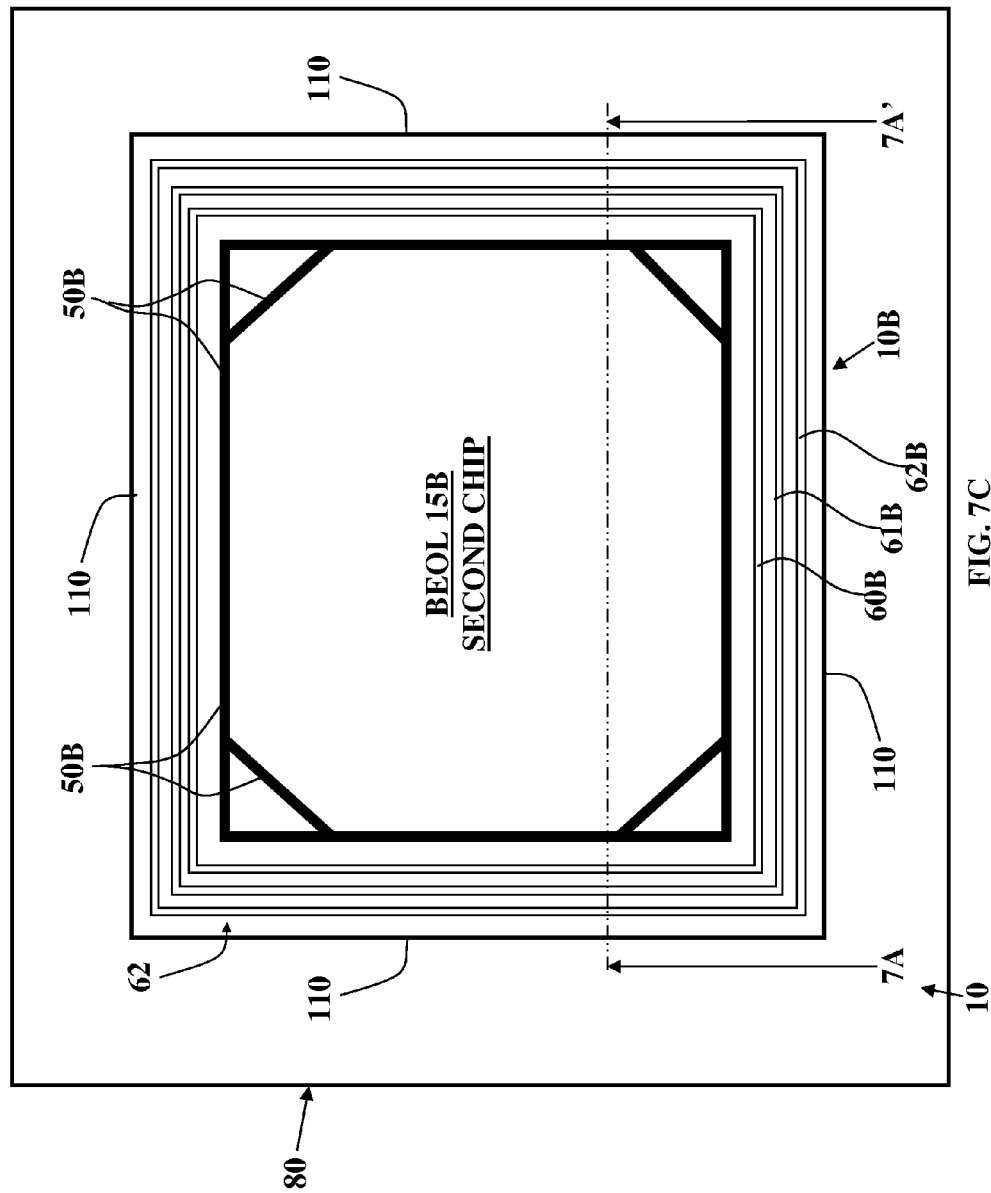

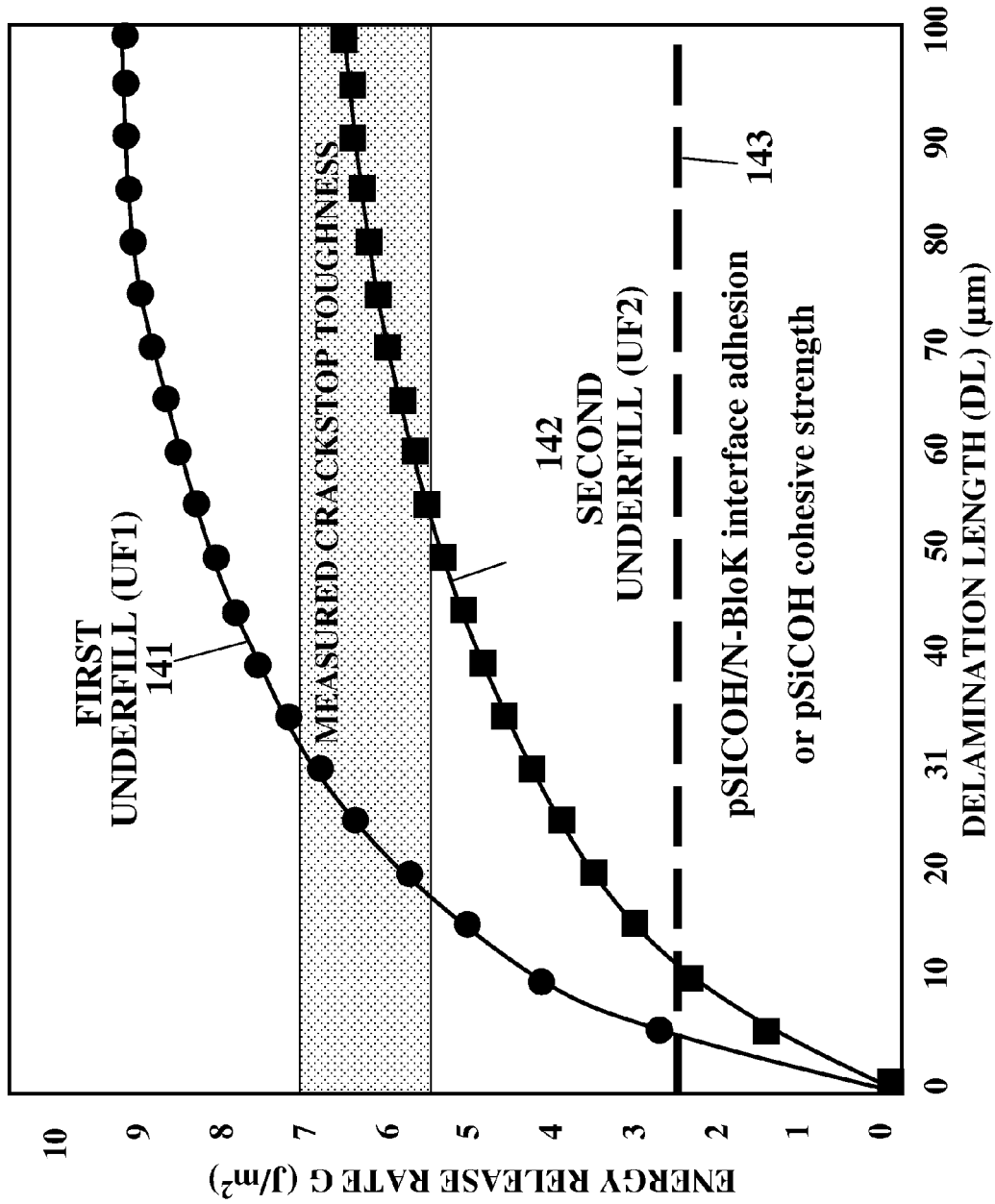

STRUCTURE FOR INHIBITING BACK END OF LINE DAMAGE FROM DICING AND CHIP PACKAGING INTERACTION FAILURES

This application is a division of copending U.S. patent application Ser. No. 11/746,684 filed 10 May 2007, entitled "Inhibiting Damage From Dicing and Chip Packaging Interaction Failures in Back End of Line Structures"

BACKGROUND OF THE INVENTION

The present invention relates to Integrated Circuit (IC) semiconductor devices and structures. More particularly it relates to structural features on semiconductor wafers resistant to cracking within the interconnect stacks. The structural features are adapted to prevent damage to semiconductor devices caused by subdivision of semiconductor wafers into individual chips by a process known as dicing. In addition, this invention relates to prevention of chip packaging interaction fails in interconnect structures formed during Back End Of Line (BEOL), interconnect, processing of semiconductor devices, late in the manufacturing process.

Microelectronic semiconductor IC devices such as Complementary Metal Oxide Semiconductor Field Effect Transistor (CMOS FET) devices and the like are manufactured in a complex process in which numerous separate electronic devices are formed. Such processes of manufacture, which produce large numbers of such electronic devices, are referred to as Very Large Scale Integration (VLSI) processes. After many processing steps, the monolithic, semiconductor wafers must be subdivided by dicing to form the numerous, individual semiconductor chips.

Referring to FIG. 1A a schematic, sectional, fragmentary, elevation is shown of a prior art type of CMOS FET, monolithic, semiconductor device 10 in an advanced stage of manufacture of the type which includes numerous VLSI electronic IC devices. However, for convenience of illustration and explanation, the only portion of the semiconductor device 10 that is shown in FIG. 1A includes a first chip 10A which is juxtaposed with a second chip 10B. Those two chips represent a large number of such chips included elsewhere in the semiconductor device 10. Semiconductor devices including the first chip 10A and the second chip 10B are formed in the active device Front End Of Line (FEOL) region within a semiconductor substrate 12 and upon the top surface 16 thereof. The substrate 12 usually comprises a single silicon (Si) semiconductor wafer. FIG. 1B shows the first chip 10A separated from the second chip 10B, after performing a dicing step, as described below.

Initially, an active device FEOL region 14 (shown in an abstract form as a layer with features obscured) is formed on the top surface 16 of the substrate 12 during FEOL processing, prior to BEOL processing. The active device FEOL region 14 contains structures, e.g. CMOS FET devices (not shown for convenience of illustration) some of which are formed in the substrate 12 and some of which are formed upon the top surface 16 thereof. As will be well understood by those skilled in the art, it is conventional for a CMOS FET device to reach above the top surface 16 of the substrate 12. Subsequently, during Back End Of Line (BEOL) processing steps, an interconnect layer 15 (also shown in an abstract form as a layer for convenience of illustration) is formed over the top surface 17 of the active device layer 14. The interconnect layer 15 contains metallic structures, typically composed of copper, that provide external interconnections (interconnects) which are formed in many levels of Intra-Level Dielectric (ILD) layers (i.e. an ILD stack) for electrically connecting the numerous FET devices, e.g. the first semiconductor chip 10A (on the left) and the second semiconductor chip 10B (on the right) to external devices, as will be illustrated in FIGS. 5A/5B, etc. and described below with reference thereto. The interconnect layer 15 includes a left side portion 15A and a right hand portion 15B which are to be separated by dicing. The result of such dicing is shown in FIG. 1B.

At the base of the first chip 10A (on the left of FIGS. 1A/1B) is a first substrate portion 12A supporting a first active device layer 14A on surface 16 thereabove. Similarly, the left side portion 15A of the interconnect layer 15 is formed above the first active device layer 14A. At the base of the second chip 10B, on the right, is a second substrate portion 12B supporting a second active device layer 14B on surface 16 thereabove. Similarly, the right side portion 15B of the interconnect layer 15 is formed above the second active device layer 14B. A dicing channel 130 shown in phantom in FIG. 1A prior to dicing is located in the space between the first and second chips 10A/10B. FIG. 1B shows the dicing channel 130 after the step of dicing has been performed separating the chip 10A from the chip 10B. Although it is not shown, for convenience of illustration, the dicing channel 130 surrounds each of the chips as is well known to those skilled in the art.

In addition, separate first and second crackstops 50A/50B are formed in the interconnect layers 15A/15B surrounding the perimeter of each interconnect layer 15A/15B. Each of the first and second crackstops 50A/50B is located between the dicing channel 130 and the active area (AA) of each of the chips 10A/10B, respectively. The crackstops 50A/50B are provided along the perimeters of the chip 10A and chip 10B to protect each interconnect layer 15A/15B from damage that would otherwise be likely to be caused by cracking. Each of the crackstops 50A/50B extends entirely through the interconnect layer 15 to the top surface 17 of the active device layer 14.

As is conventional in BEOL processing, at least one layer of dielectric material is formed in the interconnect layer 15 over the active device FEOL region 14 of the semiconductor device 10. Generally, such a dielectric layer(s) is fabricated so that metal interconnect lines (described below) may be formed thereon to provide external electrical connections to the FET devices. Copper, tungsten, and aluminum, or alloys thereof, and other like metals are commonly used to form the interconnect lines. IC chips having multiple bonded dielectric layers as well as multiple layers of interconnect lines disposed thereon are well known in the art.

Often the density of the material of the dielectric layers is not uniform throughout. Film stresses and interfaces in the material allow microcracks to propagate within the dielectric layers until the microcracks encounter metal structures, e.g. vertically extending vias and horizontally extending interconnect lines. Because such metal structure are very thin, such cracks usually severely affect interconnect lines and vias causing fracture thereof resulting in chip failure since the external connections to chip elements have been broken. The dicing process often causes cracks that damage active areas of chips such as chips 10A/10B. Thus to prevent such catastrophic damage, as is conventional, crackstops 50A/50B are provided along the perimeter of the BEOL structures 15A/15B of each of the chips 10A/10B to protect them from potential damage caused by cracking.

The manufacture of devices such as the semiconductor device 10 requires the performance of many preliminary steps, such as FEOL steps that form the active device FEOL region 14 in the substrate 12 and thereabove followed by BEOL step during which the interconnect layer 15 is formed over the active device layer 14.

Eventually after performance of many FEOL and BEOL processing steps the monolithic, semiconductor device 10 containing the numerous, VLSI semiconductor chips is subdivided by a dicing process to form individual, separate chips. During the dicing process the chips which have been formed on the substrate 12 are separated from each other. For example the first chip 10A is separated from the second chip 10B. The dicing process is confined to making cuts in intermediate spaces such as the dicing channels 130, which are located between the first chip 10A and the second chip 10B.

In FIG. 1B, as stated above, the first chip 10A is shown separated from the second chip 10B, after performing a conventional dicing step performed by cutting down through the semiconductor device 10 from the top surface 18 of the BEOL structure 15 to the bottom surface 19 of the substrate 12 within the dicing channel 130 between the chips 10A/10B with the cut at the location of the dicing channel extending all the way down through the bottom surface of the substrate 12. During dicing, a set of peripheral diced chip edge surfaces 110 are formed on the vertical edges of each of the chips 10A/10B approximately along the edge of the chip-to-chip dicing channel 130 on the sidewalls of the diced chips 10A/10B where material has been removed.

Manifestly, the dicing process is destructive because it generates stresses and strains which often induce microcracks in the semiconductor substrate 12, the active device layer 14, and/or the dielectric layers in the interconnect layer 15. As microcracks occur in a silicon substrate 12 they usually propagate very rapidly thereby causing failures that show up in the initial testing. Microcracks in layers of dielectric material such as those found in the interconnect layers 15 propagate more slowly and tend to lead to delayed failures including chip packaging interaction fails, i.e. failures which occur after devices are in the field. Chip packaging interaction failures, as well as failures in the field, are very expensive and disruptive. Thus there is a very significant need to provide a process that reduces propagation of microcracks in dielectric layers.

A high priority goal of VLSI manufacturing is production of a high yield of chips from each wafer, thereby assuring commercial profitability. As the number and complexity of chips per wafer increases, the yield often decreases proportionally. Accordingly, it is highly desirable to minimize the number of defective chips.

In the FEOL steps, electronic devices such as CMOS FET devices are formed by a series of steps including creation of photolithographic masks which used to form patterns on the semiconductor substrate 12. Etching and deposition is performed with materials being introduced in blanket form onto exposed surfaces in, on, and/or above the substrate 12 by deposition or growth of materials in blanket form or in specific regions by introduction of material onto surfaces through open mask windows. In other steps, material is removed from surfaces and structures subtractively, e.g. by etching with or without etching through open mask windows.

In the BEOL processing steps, the IC fabrication process continues by building interconnects containing multiple layers of wiring and dielectric passivation layers on the top surface 17 of the active device FEOL region 14 that contains the semiconductor devices. As stated above, the metallic structures for providing external interconnections (interconnects) are formed in many levels of ILD layers for electrically connecting the numerous devices on the semiconductor chips 10A/10B to external devices using similar processing techniques. The conventional barrier structures 50A/50B in FIGS. 1A/1B, known as crackstop/MOB (Moisture Oxidation Barrier) structures, are formed on the periphery of the interconnect layers 15A/15B of each chip 10A/10B adjacent to the dicing channel 130 where the dicing is to occur. In fact a conventional barrier structure 50A/50B may comprise a crackstop or MOB structure. Then upon completion of substrate-level FEOL and BEOL processing, the semiconductor devices 10A/10B are ready to be divided into individual semiconductor chips by dicing through the dicing channel 130 to provide separation into individual chips including the first chip 10A and the second chip 10B.

As stated above, FIG. 1B depicts the prior art semiconductor device 10 of FIG. 1A after dicing thereof, during which the semiconductor device 10 has been split into the first chip 10A and the second chip 10B by cutting through the layers of the device in dicing channel 130 between the first and second chips 10A/10B. The result of the dicing process is that the active device FEOL region 14 and the interconnect stack 15 of FIG. 1A are split in two. On the left the first chip 10A includes a first active device 14A and a first chip interconnect 15A. On the right the second chip 10B includes a second active device 14B and a second chip interconnect 15B. However, as stated above, the problem with dicing of semiconductor devices is that the dicing process generates stresses and strains which can lead to cracking. The dicing process often causes cracks that damage Active Areas (AA) of the chips. Such cracking can damage the devices and metallization on the semiconductor chips. To prevent such damage, the crackstops 50A/50B have been provided along the perimeter of the chips 10A/10B to interrupt propagation of cracks beyond them.

As stated above, dicing damage causes cracking within the interconnect stacks 15A/15B of ILD and metallization layers. Such dicing-initiated cracking can affect one or more of the many ILD layers in a BEOL structure 15, resulting in a loss of structural integrity. The cracking problem is exacerbated upon a subsequent step of joining semiconductor chips 12A/12B, etc. to packaging substrates. Moreover, the problem is at its worst when the packaging substrate comprises an organic material as compared with a ceramic packaging substrate. The delta value of the Coefficient of Thermal Expansion (CTE) mismatch between different assembled materials in the device being manufactured causes greater strains and stresses on the semiconductor chips, which, in turn, generate the growth of cracks within layers in a BEOL structure.

An object of this invention is to provide a structure that inhibits cracks from damaging the BEOL structure of a chip or even inhibits cracks from damaging the Active Area below the BEOL structure in the chip.

The active areas AA of the chips 10A/10B are located in each of the two substrate regions 12A/12B, including both the interconnect stack 15A/15B and the active device layer 14A/14B and inside the crackstops 50A/50B. A typical crackstop 50A/50B is a solid metal structure formed in a trench spanning all interconnect levels or a plurality of solid metal structures spanning all interconnect levels around the periphery of each chip on a semiconductor wafer.

New Failure Mechanisms

In the past, the weakest material in an IC structure has been the material of the substrate 12, which is typically composed of a semiconductor material such as monocrystalline silicon. However, the increased demand for improvement in the performance of ICs has led to the introduction of low dielectric constant (low-k) ILD layers in the interconnect stack 15. The low-k materials have less mechanical (cohesive) strength than traditional dielectrics such as silicon dioxide ($SiO_2$).

In particular, FIG. 2A is a chart which shows that the cohesive strength value of an ILD layer of a semiconductor chip decreases as a function of decreasing of the dielectric constant value. There is a problem, that the contemporary strategy of lowering of the cohesive strength of the ILD layer has resulted in the shifting of the location of the weakest material in an integrated structure from the substrate (which is typically monocrystalline silicon) to the ILD layers. Thus, the result of the strategy of use of low-k materials in the ILD layer has introduced new failure mechanisms during the steps of dicing of wafers into chips and subsequent packaging and reliability testing.

A key requirement for stopping these new failure mechanisms is to limit the propagation distance, i.e. the Delamination Length (DL), to which a flaw generated during the dicing process can propagate before it encounters the crackstop/MOB structure. While there are a number of potential solutions to this problem, in the past solutions which have been employed have required either a loss in productivity (reduction in number of chips per wafer) or a loss in I/O density due to a redesign of a Controlled Collapse Chip Connection (C4) layouts.

FIG. 2B is a chart which shows the energy imparted to dielectric layers due to the packaging material as a function of the defect size, i.e. length, of a flaw which is created during dicing and which propagates during reliability stressing. As the flaw extends to greater lengths, there is a monotonic increase in the energy release rate tending to drive the flaw towards failure. If a flaw is allowed to grow large enough, sufficient energy will build up to (first) either break through the crackstop/MOB structure or (second) dive down into the silicon (Si) substrate and into the Active Area (AA) of the chip. Therefore the most robust path to ensuring reliability is to limit the flaw size.

Commonly assigned U.S. Pat. Nos. 5,530,280 and 5,665,655 of White, both entitled "Process for Producing Crackstops on Semiconductor Devices and Devices Containing the Crackstops" describe a process for making semiconductor device with a crackstop formed by a groove filled with metal surrounding the active region on a chip at the same time as other functional metallization is occurring. Then after final passivation selective etching removes the metal in the groove. The groove passes through the surface dielectric or the semiconductor substrate, or is replaced by hollow metal rings stacked through multiple dielectric layers.

Underfill layers have been employed in IC packaging to protect the Surface Mount Devices (SMDs), i.e. IC chips bonded to a Printed Circuit (PC) board with solder ball joints. During the mounting process, the solder balls on SMD IC chips are aligned with electrical contact pads on the PC board. Subsequently the PC board is heated causing the metal of the solder ball joints to flow, joining the chips with contact pads on the PC board. Next an underfill epoxy material is introduced between the chip and the board. Then the PC board is reheated to cure the epoxy, forming a seal around the chip to protect it from moisture and to help to preserve the integrity of the solder balls joints.

U.S. Pat. No. 6,822,315 of Kelkar et al. entitled "Apparatus and Method for Scribing Semiconductor Wafers Using Vision Recognition" refers to U.S. Pat. No. 6,245,595 entitled "Techniques for Wafer Level Molding of Underfill Encapsulant," as describing use of a cured or a partially cured epoxy underfill type of layer on the top surface of a wafer before it is diced rather than after dicing and before mounting on a PC board. The epoxy layer, that protects the chips during handling, is formed on the top surface of the wafer and includes an epoxy resin, a hardener, a catalyst, a filler material (e.g. silicon particles) and a dye. The filler material reduces the CTE of the epoxy to match that of the PC board upon which the micro SMDs will be mounted. As temperature variations occur, the PC board and epoxy expand and contract at similar rates. Without the filler material, the rates of expansion and contraction would be different, resulting in potential joint failures, over time.

Commonly assigned U.S. Pat. No. 6,566,612 B2 of Brouillette et al entitled "Method for Direct Chip Attach by Solder Bumps and an Underfill Layer" states that in a conventional flip chip process, an underfill material with thermal expansion characteristics which are CTE matched to solder by using fillers in the underfill composition is frequently dispensed after chip-substrate attach by a capillary action through the gap between the chip and the substrate.

U.S. Patent Application 20060125119 of Xiao et al. entitled "B-Stageable Underfill Encapsulant and Method for its Application" describes several compositions of underfill materials applied directly onto semiconductor wafers before dicing the wafers into individual chips.

U.S. Pat. No. 6,492,247 B1 of Guthrie et al. (commonly assigned) entitled "Method for Eliminating Crack Damage Induced By Delaminating Gate Conductor Interfaces In Integrated Circuits" describes managing crack damage in the ICs to reduce or eliminate crack propagation into the IC active array by providing a defined divide or separation of the IC gate conductor from the IC crackstop or edge. The method is employed to manage crack damage induced through the delamination of one or more of the gate conductor surface interfaces as a result of the IC wafer dicing process.

Commonly assigned U.S. Patent Application No. 2004/0129938 A1 of Landers et al. entitled "Multi-Functional Structure for Enhanced Chip Manufacturibility & Reliability for Low K Dielectrics Semiconductors and a Crackstop Integrity Screen and Monitor" describes an on-chip redundant crackstop providing a barrier to prevent defects, cracks, delaminations, and moisture/oxidation contaminants from reaching active circuit regions. Conductive materials in the barrier structure permit wiring the barriers out to contact pads and device pins for coupling a monitor device to the chip to monitor barrier integrity.

U.S. Patent Application No. 2005/0208781 A1 of Fitzsimmons et al. (commonly assigned) entitled "Crackstop With Release Layer For Crack Control In Semi-conductors" describes forming an IC device with vertical interfaces (adjacent to a crackstop on the perimeter of a chip) which controls cracks generated during steps such as side processing of the device, e.g. dicing, and controls cracks when the chips are in service by preventing a crack from penetrating the crackstop. The vertical interface is comprised of a material that prevents cracks from damaging the crackstop by deflecting cracks away from penetration of the crackstop, or by absorbing the generated crack energies. The vertical interface may be a material that allows advancing cracks to lose enough energy so they cannot penetrate the crackstop. The vertical interfaces can be implemented in a number of ways such as, vertical spacers of release material, vertical trenches of release material or vertical channels of the release material. There can be voids in the material such as an ultra low-k dielectric layer formed in a vertical trench juxtaposed with the crackstop.

The Abstract of Japanese Patent Publication 2004-111946 of Kubo et al entitled "Laser Dicing Equipment and Dicing Method" describes use of laser heads to perform dicing. For example, the laser heads are indexed from both ends to the center of a wafer, or from the center of the wafer to both ends. Alternatively, the laser heads are arranged separated from each other by a prescribed number of lines and indexed in the same direction, and two lines are carved into the wafer throughout its surface.

US2006/0057822A1 (commonly assigned) of Daubenspeck et al. entitled "Chip Dicing" describes a semiconductor structure and method for chip dicing, wherein first and second device regions of first and second chips are formed in and at the top of the semiconductor substrate. The chips are separated by a semiconductor border region of the semiconductor substrate. N interconnect layers are formed directly over the semiconductor border region and first and second device regions, where N is a positive integer, with each of N interconnect layers comprising an etchable portion directly above the border region. Etchable portions of the N interconnect layers form a continuous etchable block removed by etching. Then a laser cuts through the semiconductor border region forming an empty space by removal of the continuous etchable block to separate the first chip from the second chip.

The Abstract of Japanese Patent Publication 2005-109322 of Yakasuki et al describes a "Laser Beam Dicing Device" with the laser head of a laser beam dicing device that includes a plurality of laser oscillators and light-condensing means which condense oscillated laser light beams individually and an optical path collecting means which collects the laser light beams onto one optical axis. The laser beam dicing device is useful with various processes, e.g. formation of a multilayered reformed area in a wafer, a composite process by which the formation of the reformed area in the wafer and the cutting of the die attaching tape are performed simultaneously, or the like, with the laser light beams converging at different positions.

In Guthrie, an air gap is described formed in a structure that extends to the active device region to the edge of a gate electrode and over the edge thereabove but not reaching down to the surface of the substrate therebelow. We have discovered that there is a problem that such a structure cannot prevent delaminations.

Fitzsimmons et al provides a void down to a cap layer with no indication of what is formed below the cap layer. The application initially mentions substrates but fails to show a substrate or indicate what is below the cap layer.

As stated above, a key requirement for preventing these new failure mechanisms described above is to limit the propagation distance that a flaw (generated during the dicing process) can propagate before it encounters the barrier (crackstop/MOB) structure. While there are a number of potential solutions to this problem, heretofore all solutions known require either a loss in productivity (reduction in number of chips per wafer) or a loss in I/O density (due to a redesign of a Controlled Collapse Chip Connection (C4) layout).

SUMMARY OF THE INVENTION

An object of this invention is to provide a structure that inhibits cracks from reaching the active chip BEOL structures.

Another object of this invention is to form a crack resistant chip edge in an IC device which provides robustness to defects generated during dicing from a wafer to form chips therefrom and subsequent packaging and thermal stress.

Similarly it is an object of this invention to provide a method for manufacturing a crack resistant chip edge in an IC device.

In accordance with the present invention, a hollow chip edge trench is juxtaposed with the crackstop MOB structure. The trench is formed in the BEOL structure and must extend into the FEOL regions in the silicon substrate where it will be filled with an underfill material and provide a mechanical interlock. Were Guthrie's process taken with low-k (LK) and ultra low-k (ULK) devices, the BEOL structure would be ripped off by the mismatch in CTE which is what our present invention prevents. Thus we have discovered that it is the depth of penetration into the silicon substrate and the interlocking of the underfill with the silicon substrate that is a key difference when the present invention is compared with the structure and method of Guthrie. Accordingly, we have discovered that the underfill material must be anchored into the silicon to provide any benefit.

The present invention provides a structure and a method whereby dicing damage is prevented from reaching the crackstop region in an interconnect, by creation of a protective firewall. This firewall may be created using different methods. One particularly useful method is to use laser etching to create a laser channel. Preferably, the laser channel is created with the closest possible proximity to the crackstop, which in turn reduces the energy available for any potential crack to propagate (in this instance the crack would be one that is created as a result of the laser channel, but this in itself is an unlikely event). Such a laser channel is referred to hereinafter as an Ultra Deep Isolation Trench (UDIT.)

Fundamentally, according to the method of this invention and structure produced thereby, dicing may be performed by conventional means (e.g. saw dicing) in the appropriate zone for chip dicing. Dicing can also be performed by a combination of methods (laser dicing and saw dicing) in the appropriate zone for chip dicing. Laser channel creation close to the crackstop, creates a barrier for preventing any cracks initiated by the dicing above from penetration thereof and reaching the crackstop. Any micro-cracks created by laser channeling action (unlikely in the first place), will have a very short distance to travel before reaching the crackstop, thus preventing a high potential energy cracking situation from developing.

The edge structure of this invention can be applied to any semiconductor chip or semiconductor device that is removed from a larger plurality of devices such as a silicon semiconductor wafer as is commonly done in manufacturing FET devices. This invention is also directed to a process for making a chip edge structure.

In accordance with this invention a chip edge consists of an isolation trench or isolation trenches that penetrate into the semiconductor (Si) substrate adjacent to the crackstop and moisture/oxidation barrier active area (AA) of the device. The area outside the isolation trench or trenches may have the same levels as present in the active device level or they may be removed.

This invention provides an IC structure in chip form with a chip edge in accordance with this invention located outside the chip Active Area (AA) where the definition of is the area AA comprises the area inside the crackstop/moisture-oxidation barrier which typically spans all levels of a solid metal BEOL structure or a plurality of solid metal structures. The edge structure of this invention can be applied to any chip or device which is removed from a larger plurality of devices such as a Si wafer as is common in CMOS devices.

A key requirement for stopping these new failure mechanisms described above is to limit the propagation distance which a flaw generated during dicing process can propagate before it encounters the crackstop/MOB structure. While there are a number of potential solutions to this problem, all known solutions other than the chip edge of the present invention require either a loss in productivity (reduction in number of chips per wafer) or a loss in I/O density (due to a redesign of a Controlled Collapse Chip Connection (C4) layouts).

Glossary

BLoK: a Si—C—H compound serving as a hard mask capping layer generically referred to as silicon carbide;

N-BLoK: mostly Si—C—H—N; serving as a hard mask capping layer, generically referred to as silicon carbonitride or nitrogen doped silicon carbide;

SiCOH: hydrogenated silicon oxycarbide, which is a low-k, dielectric film comprising at least atoms of silicon (Si), carbon (C), oxygen (O,) and hydrogen (H);

pSiCOH: porous hydrogenated silicon oxycarbide which is a low-k, dielectric film comprising porous SiCOH which contains molecular scale voids (i.e., nanometer-sized pores), which reduce the dielectric constant of the SiCOH dielectric material.

BRIEF DESCRIPTION OF THE DRAWINGS

This invention will be better understood by reference to the detailed description of the invention when taken together with the attached drawings, many of which represent the edge of a chip in cross-section and are not meant to represent the entire chip but only a portion of the chip, wherein.

Figure 3A:
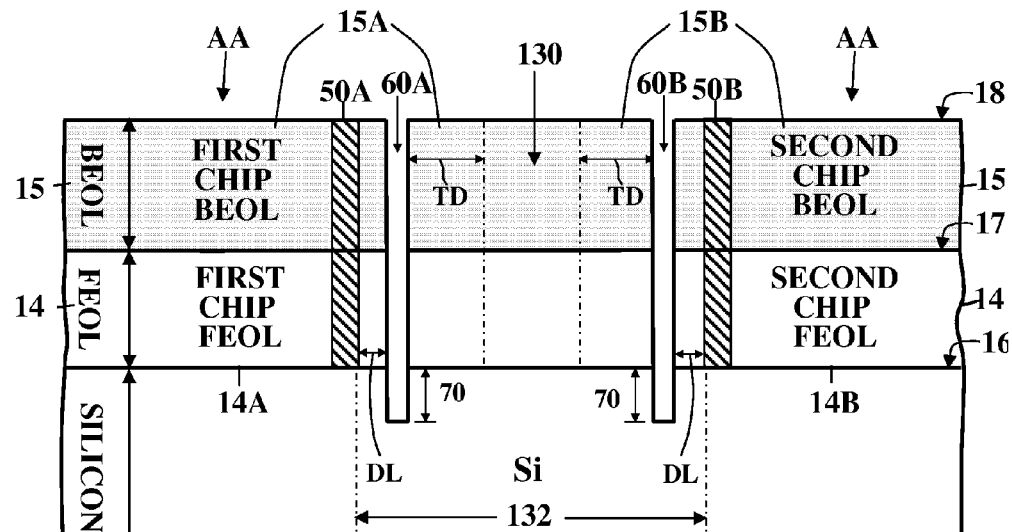
FIG. 3A shows an elevational sectional view taken along line 3A-3A' in FIG. 4 of an embodiment of this invention comprising a modification of the device of FIG. 1A in Ultra Deep Isolation Trenches (UDITs) have been added.
Figure 3B:
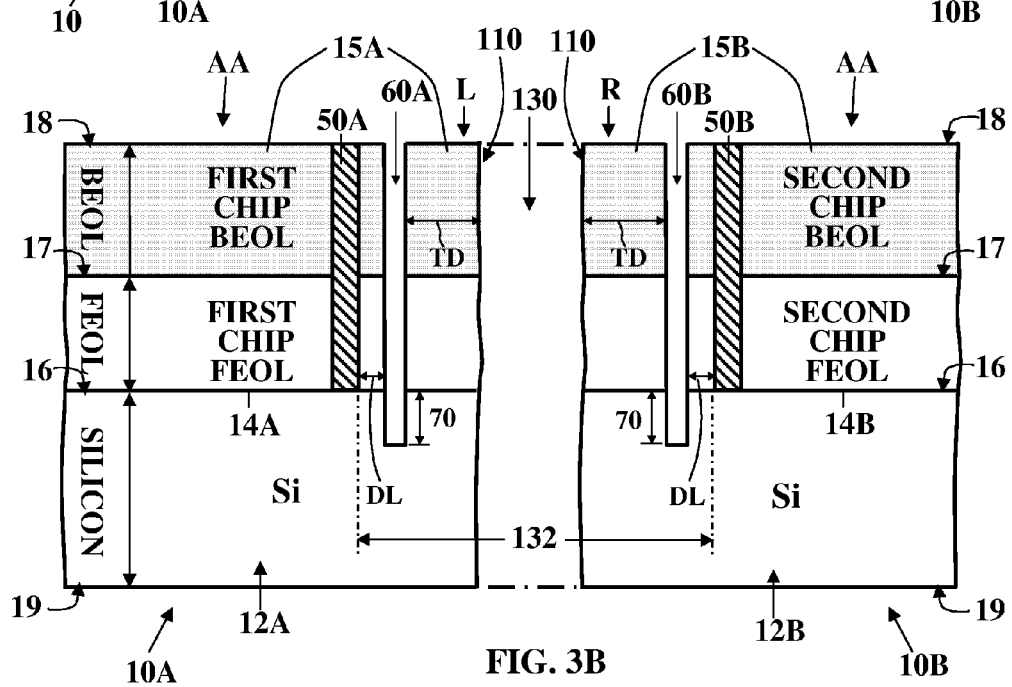
FIG. 3B shows the device of FIG. 3A after dicing through the channel to separate the first chip from the second chip and the remainder of the chips not shown in FIG. 3A.
Figure 3C:
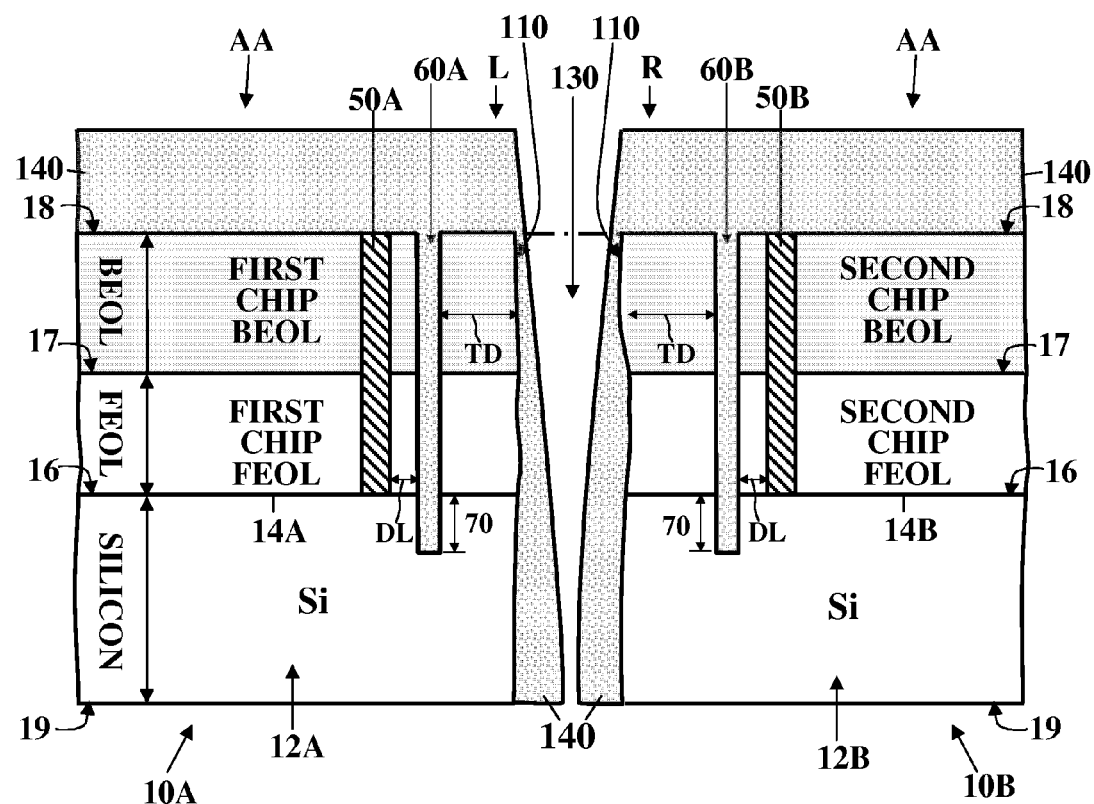
FIG. 3C shows the diced chips of FIG. 3B after depositing a blanket underfill layer thereover to protect the diced chips.
Figure 3B:
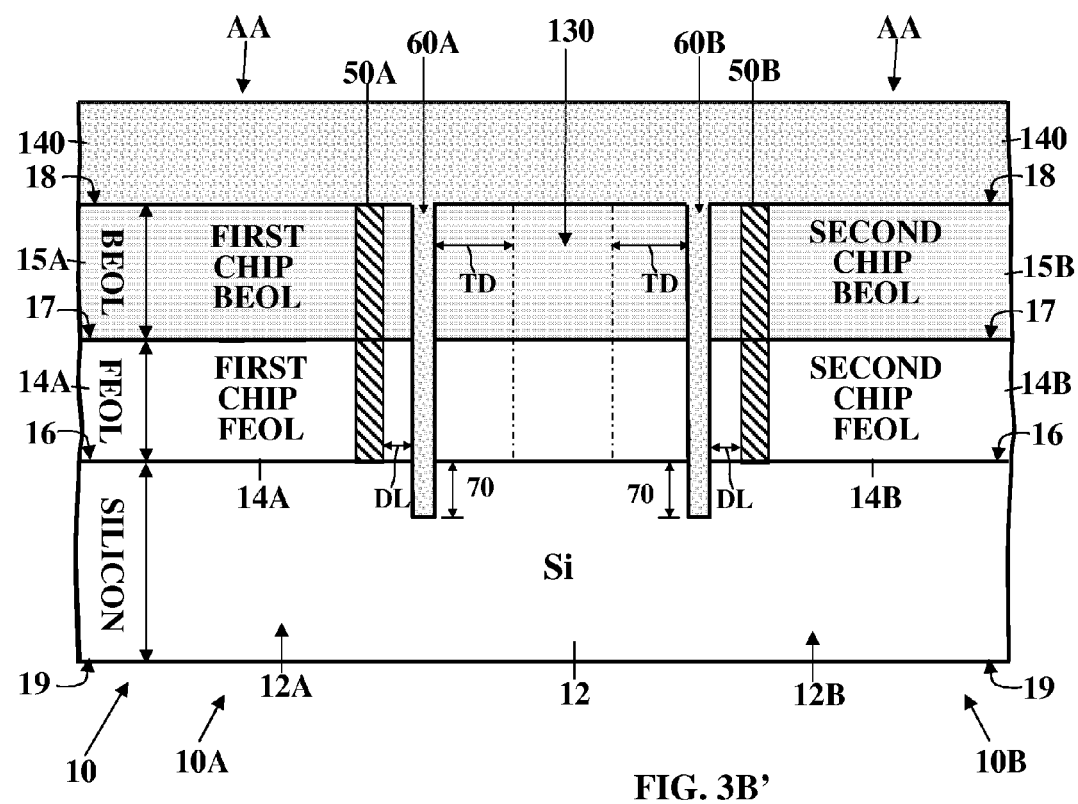
Figure 3C:
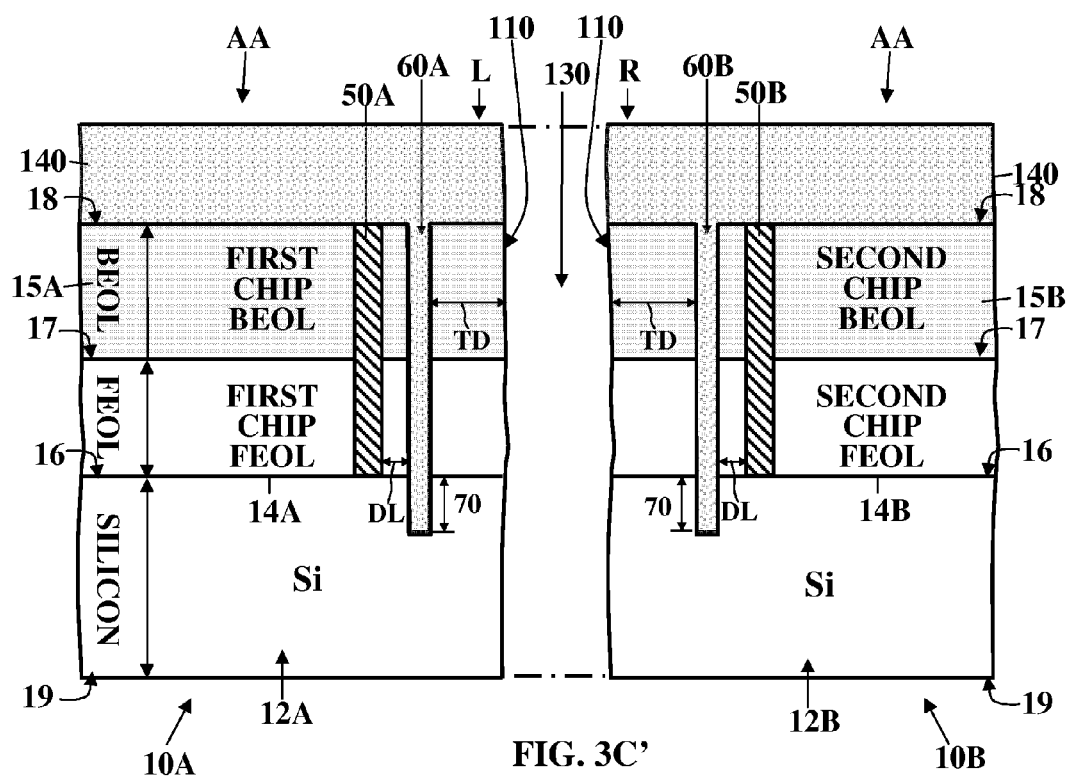
Figure 10A:
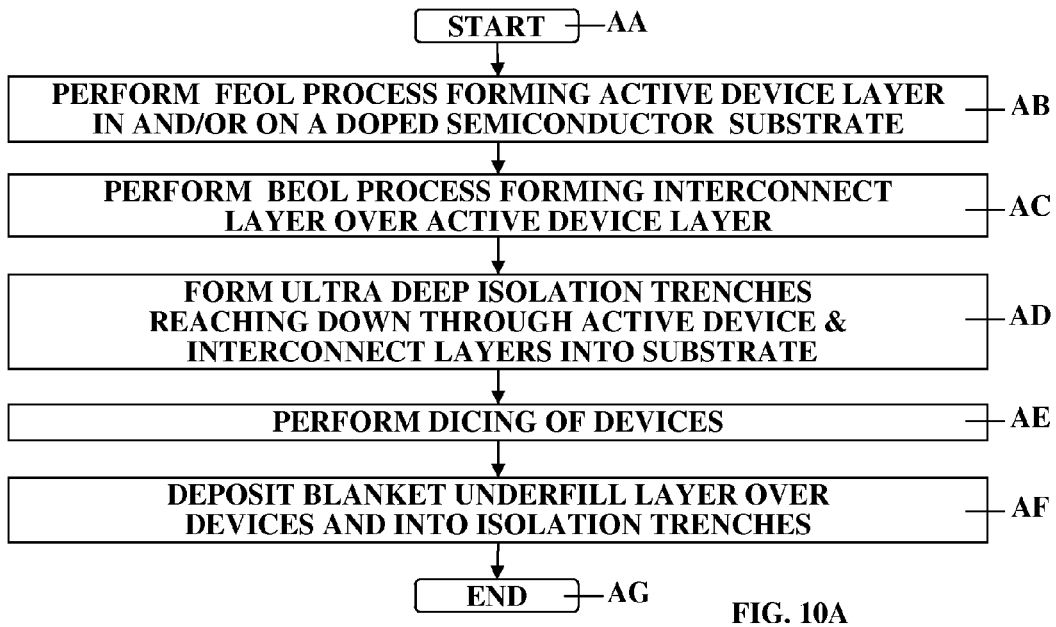
Figure 10B:
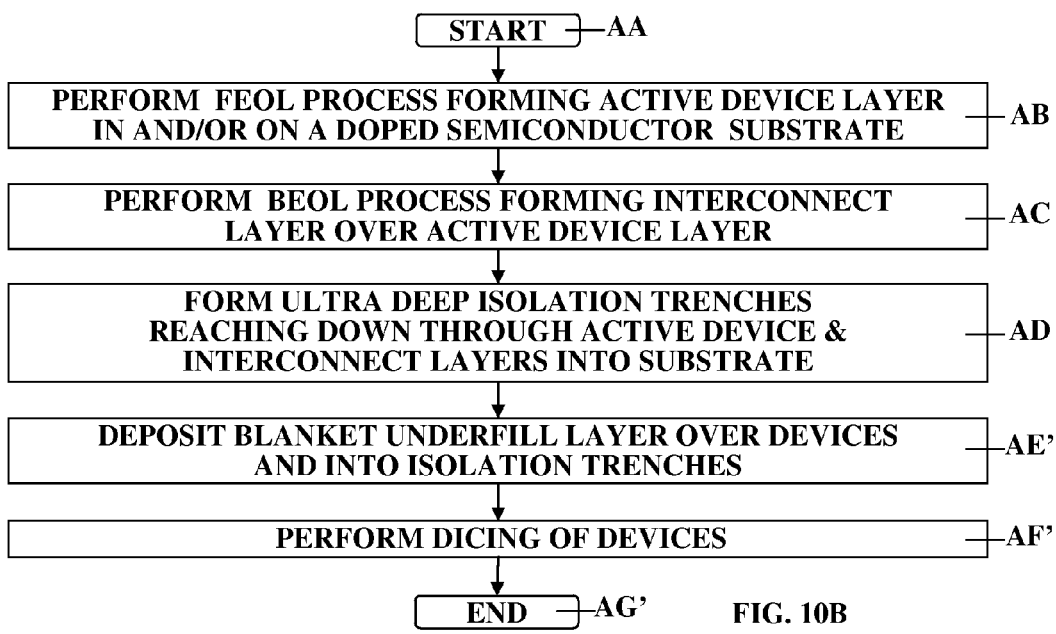

The combination of FIGS. 3A, 3B', and 3C' illustrate an alternative to the process of FIGS. 3B and 3C with reference to FIG. 10B which is a flow chart for an alternative process to that of FIG. 10A.

Figure 4:
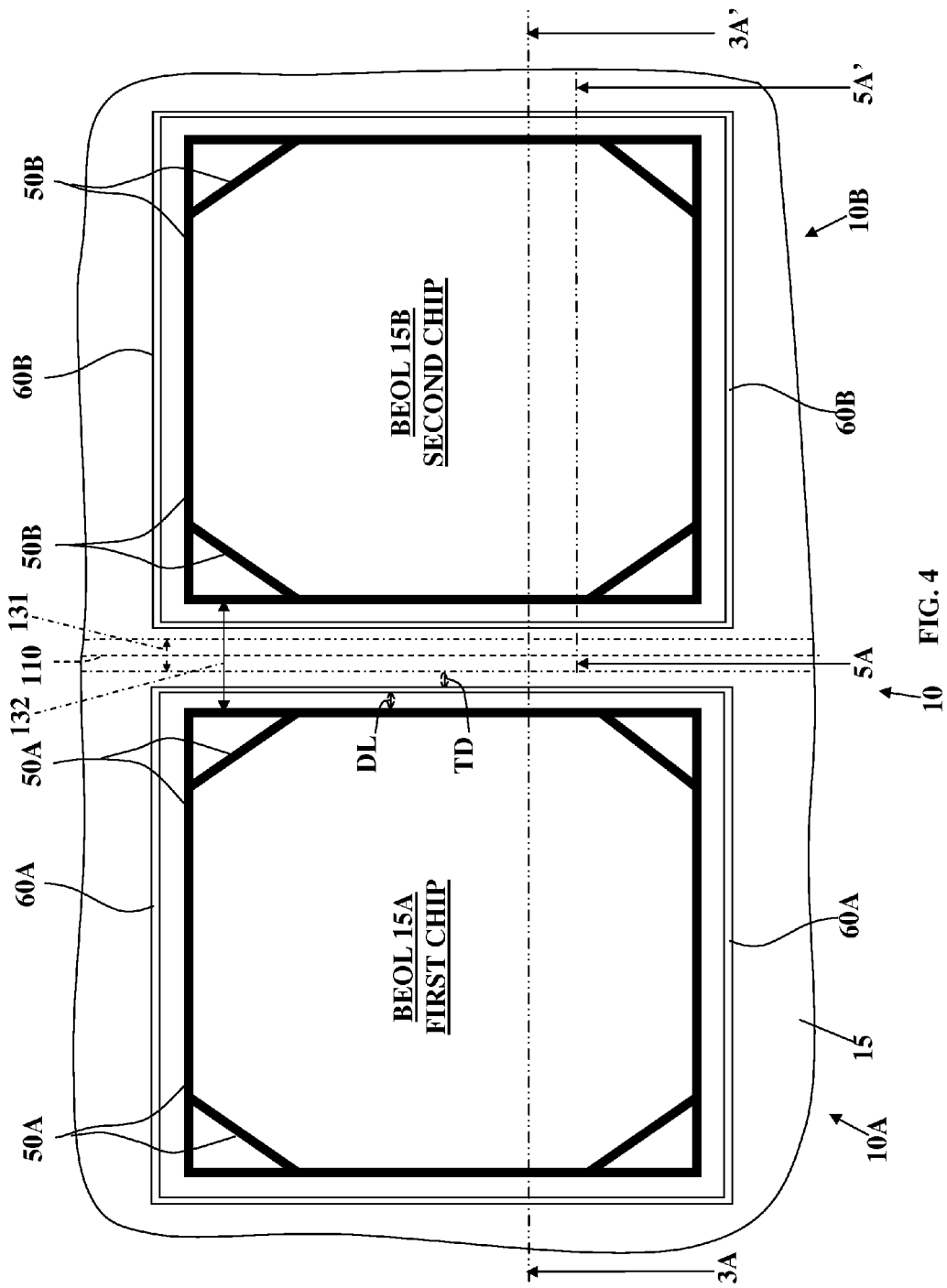

FIG. 4 is a plan view of a device in accordance with this invention with a first chip juxtaposed with a second chip with barrier rings around active areas of each of the chips, and UDITs which surround the barrier rings, separating the barrier rings from a chip-to-chip dicing channel located between the first and second chips.

Figure 5A:
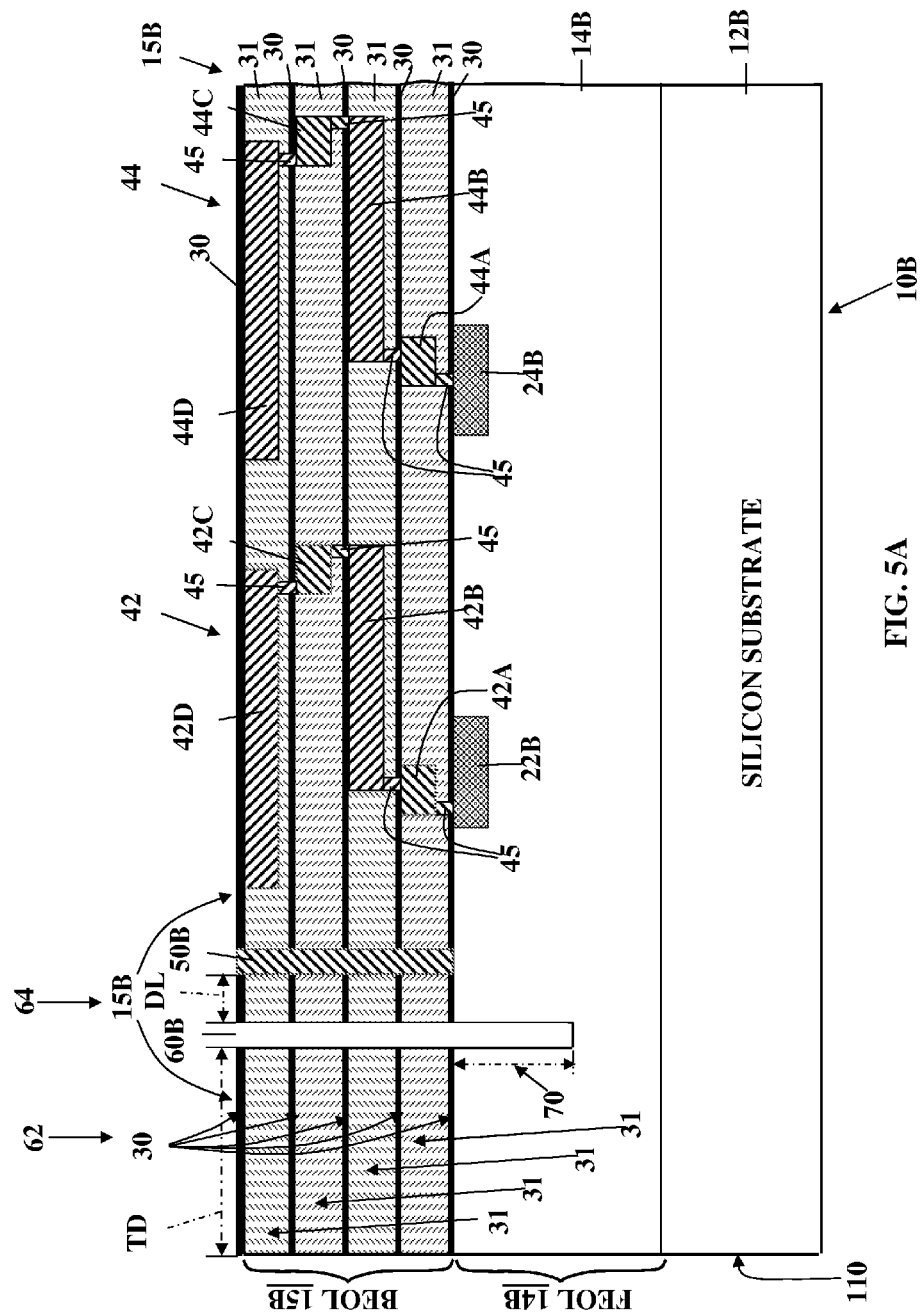

FIG. 5A is a sectional elevation taken along line 5A-5A' in FIG. 4, which shows the second chip after dicing and prior to formation of an underfill layer thereover.

Figure 5B:
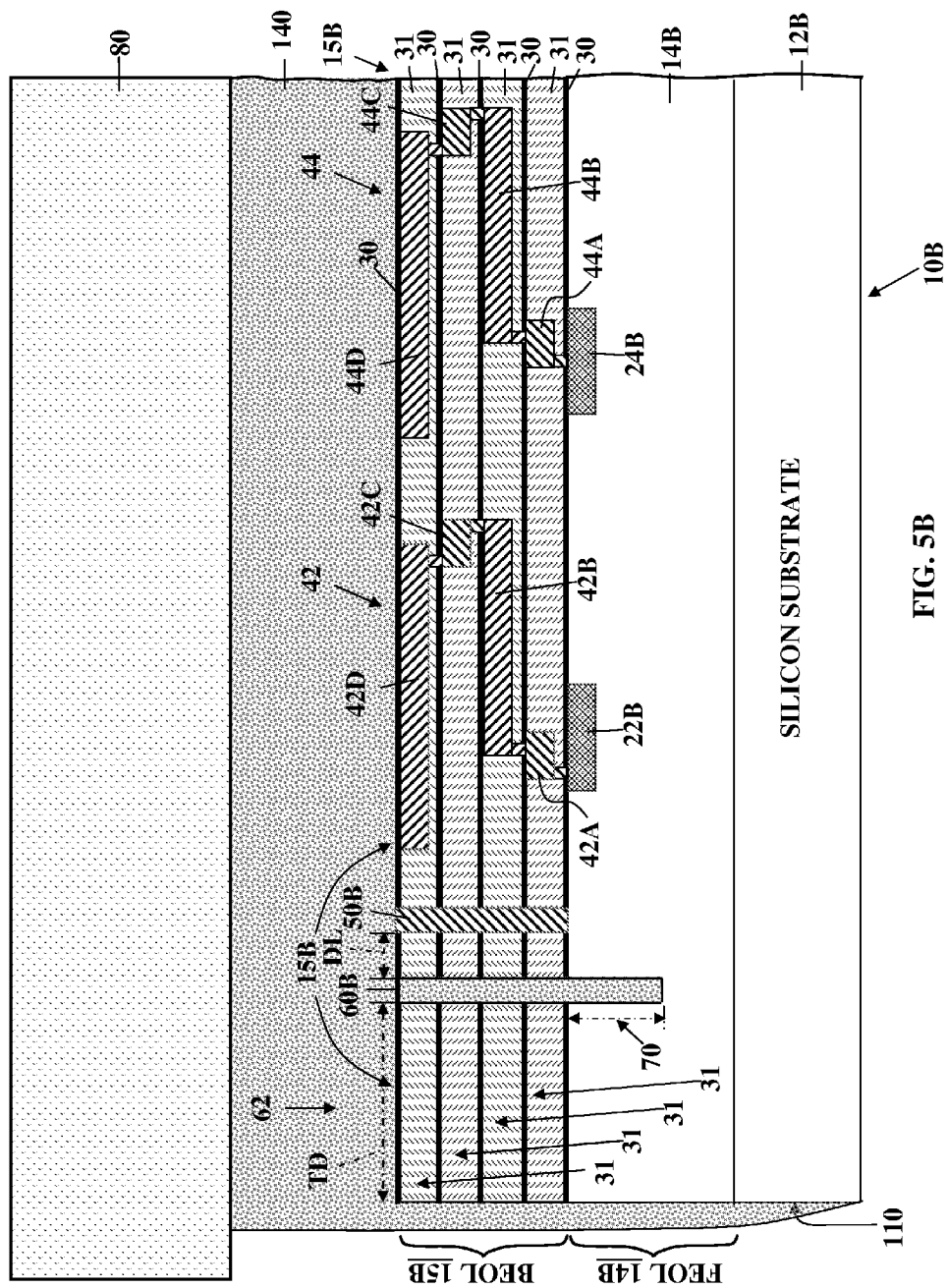

FIG. 5B shows the second chip of FIG. 5A after both forming of an underfill layer over the top surface of the chip and joining the chip to a package.

Figure 6A:
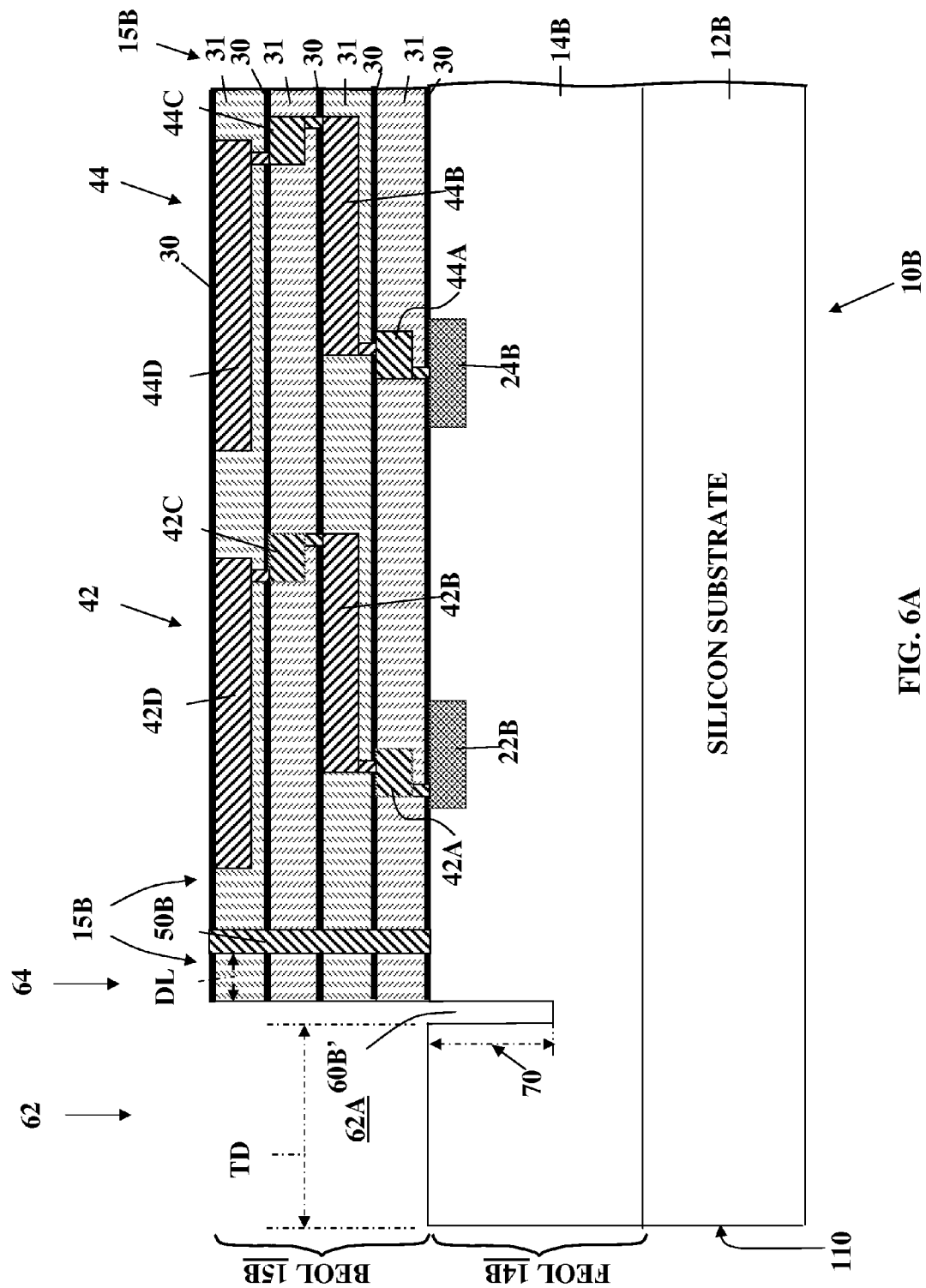

FIG. 6A shows the device of FIG. 5A with the outside area between the UDIT trench and the diced edge which has been recessed to remove the interconnect layer outboard from the UDIT trench.

Figure 6B:
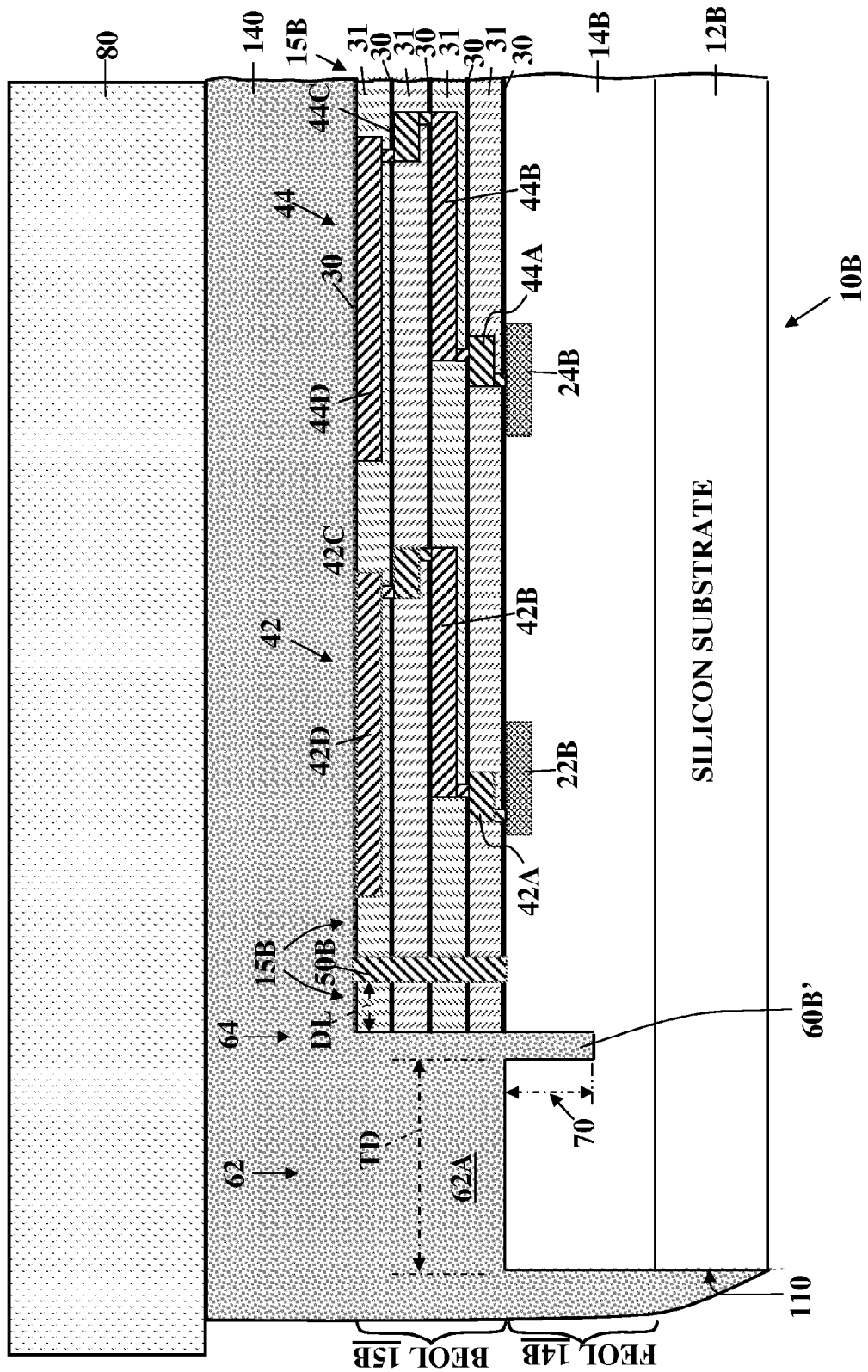

FIG. 6B shows the device of FIG. 6A after forming of an underfill layer over the top surface of the chip and joining the chip to a package.

Figure 7A:
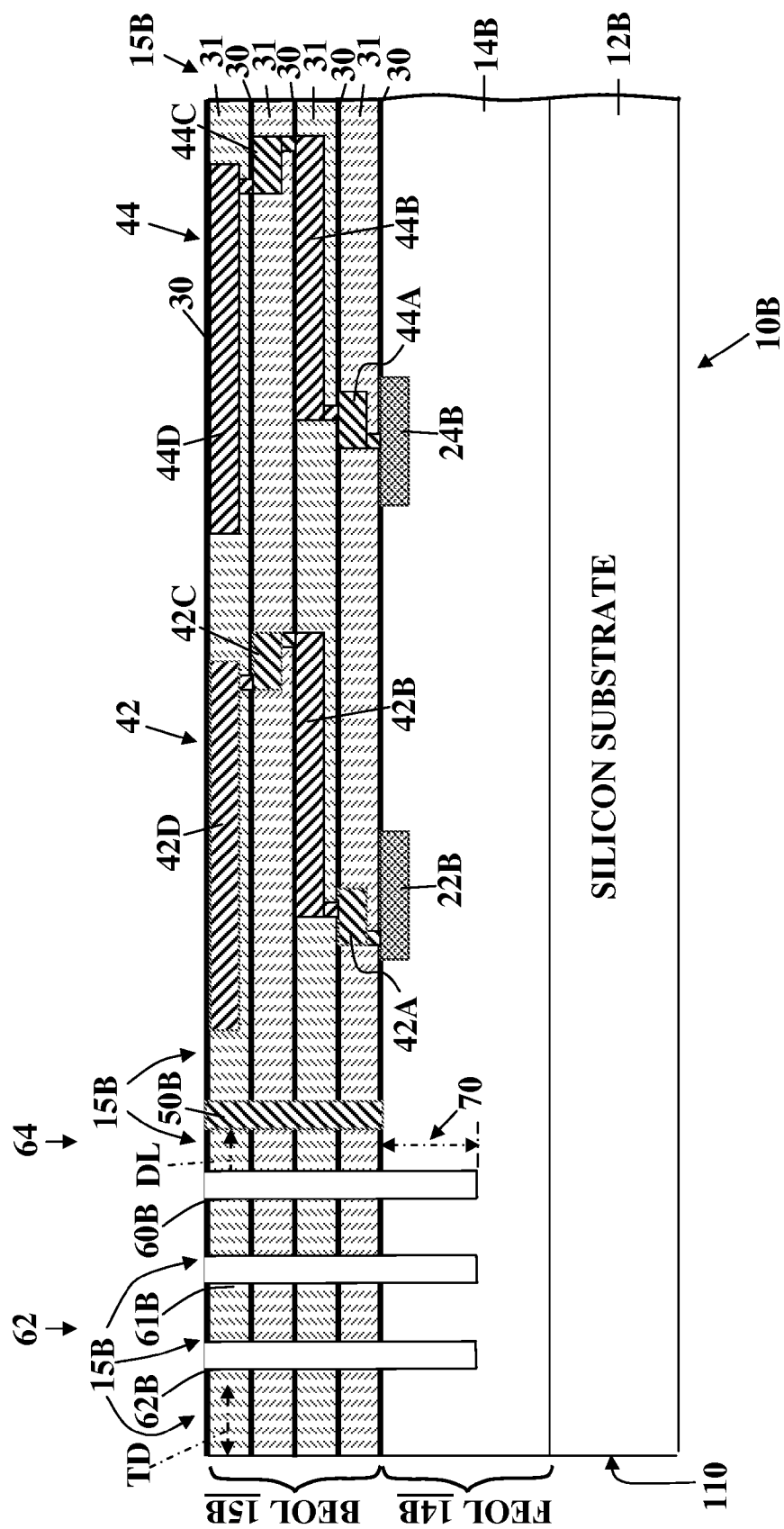

FIG. 7A shows a modification of the device of FIG. 5A in which several UDIT trenches have been formed, between the barrier structure and the chip edge.

Figure 7B:
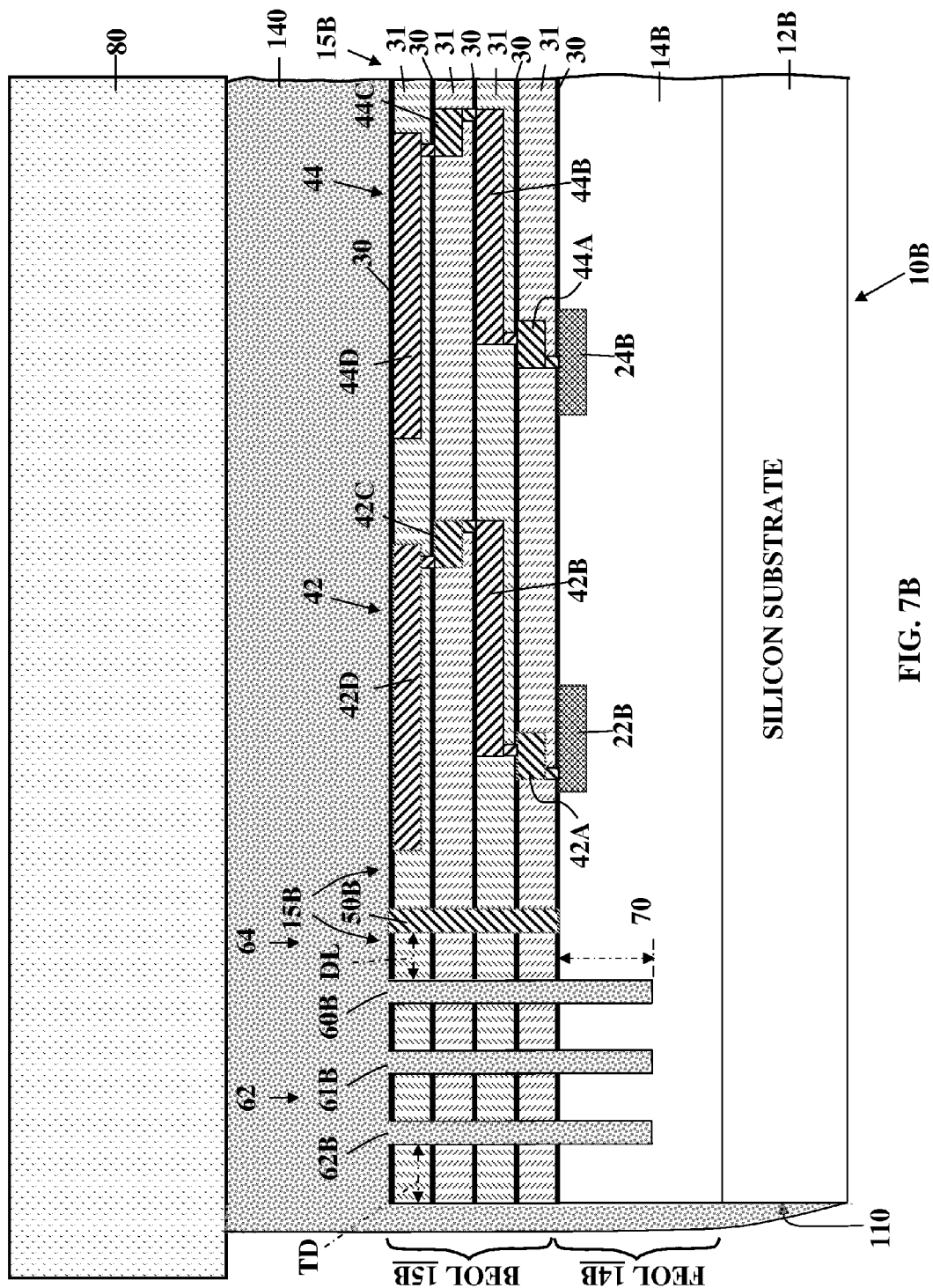

FIG. 7B shows the device of FIG. 7A after both forming of an underfill layer over the top surface of the chip and joining the chip to a package.

FIG. 7C is a plan view of the second chip of FIG. 7B with a barrier ring surrounding the active areas of the second chip, and with three UDITs formed with one inside the other around the barrier ring aside from a chip-to-chip dicing channel.

Figure 8A:
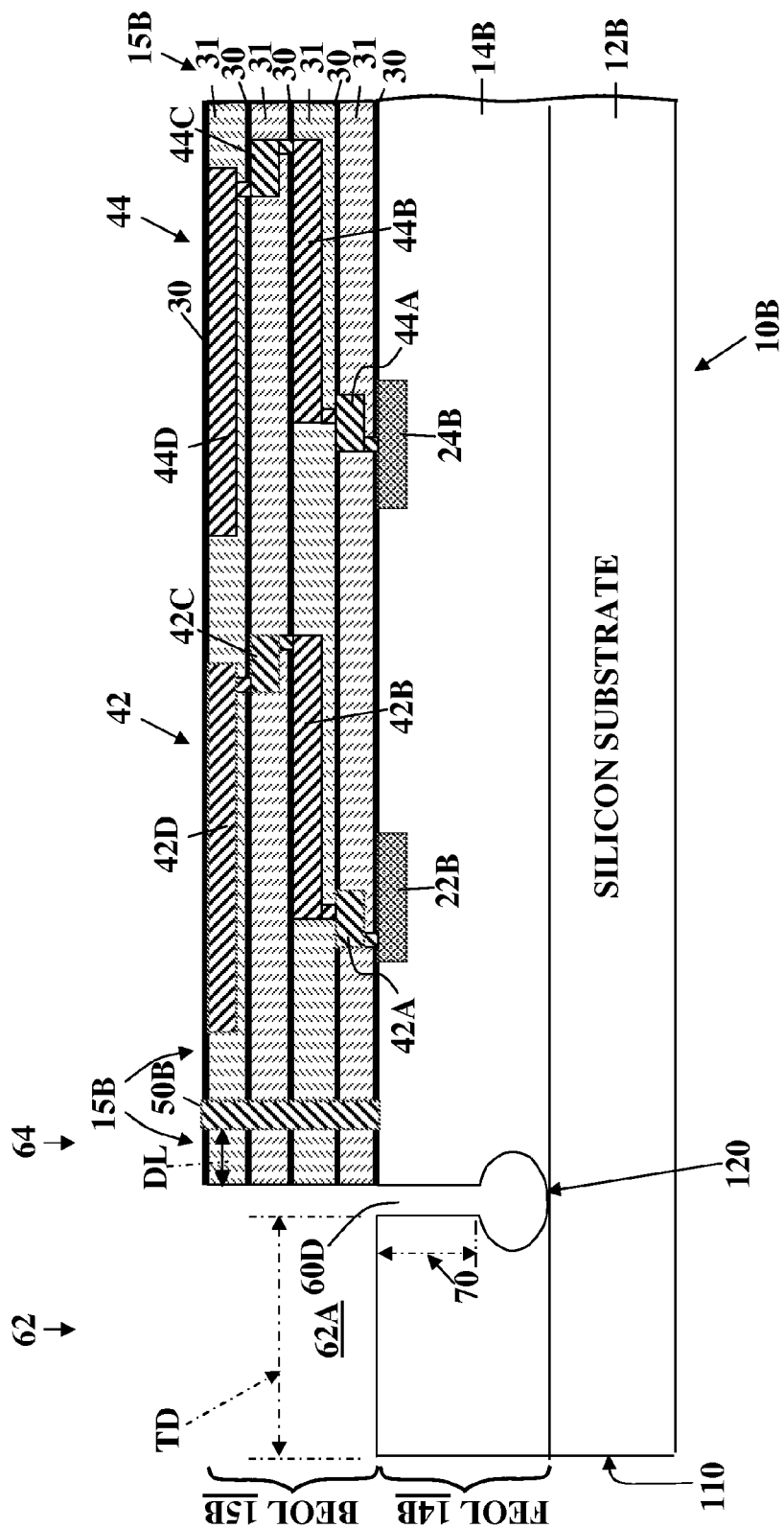
Figure 8B:
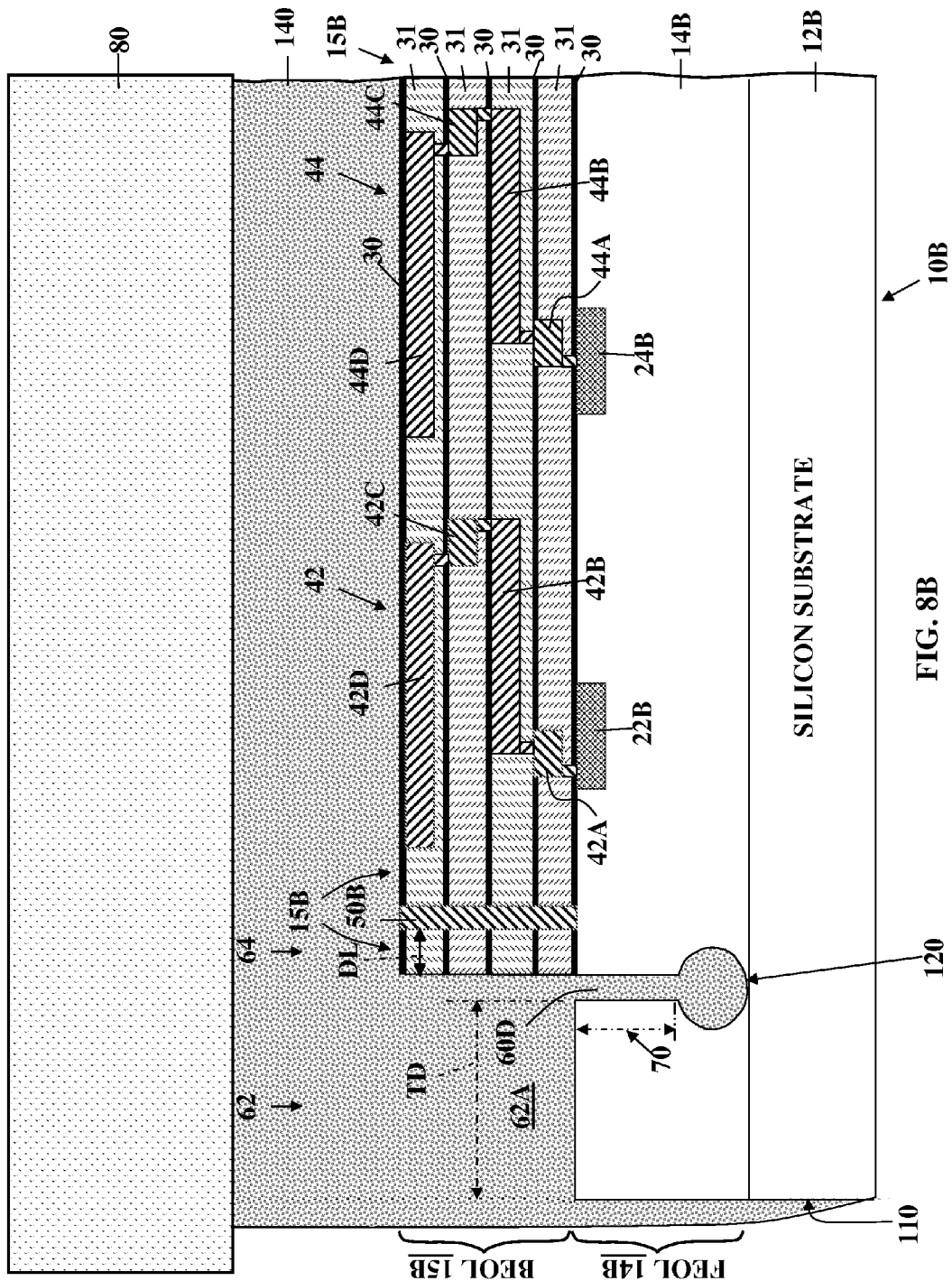

FIGS. 8A and 8B show a further modification of the embodiment of the invention shown in FIGS. 5A and 5B.

Figure 9A:
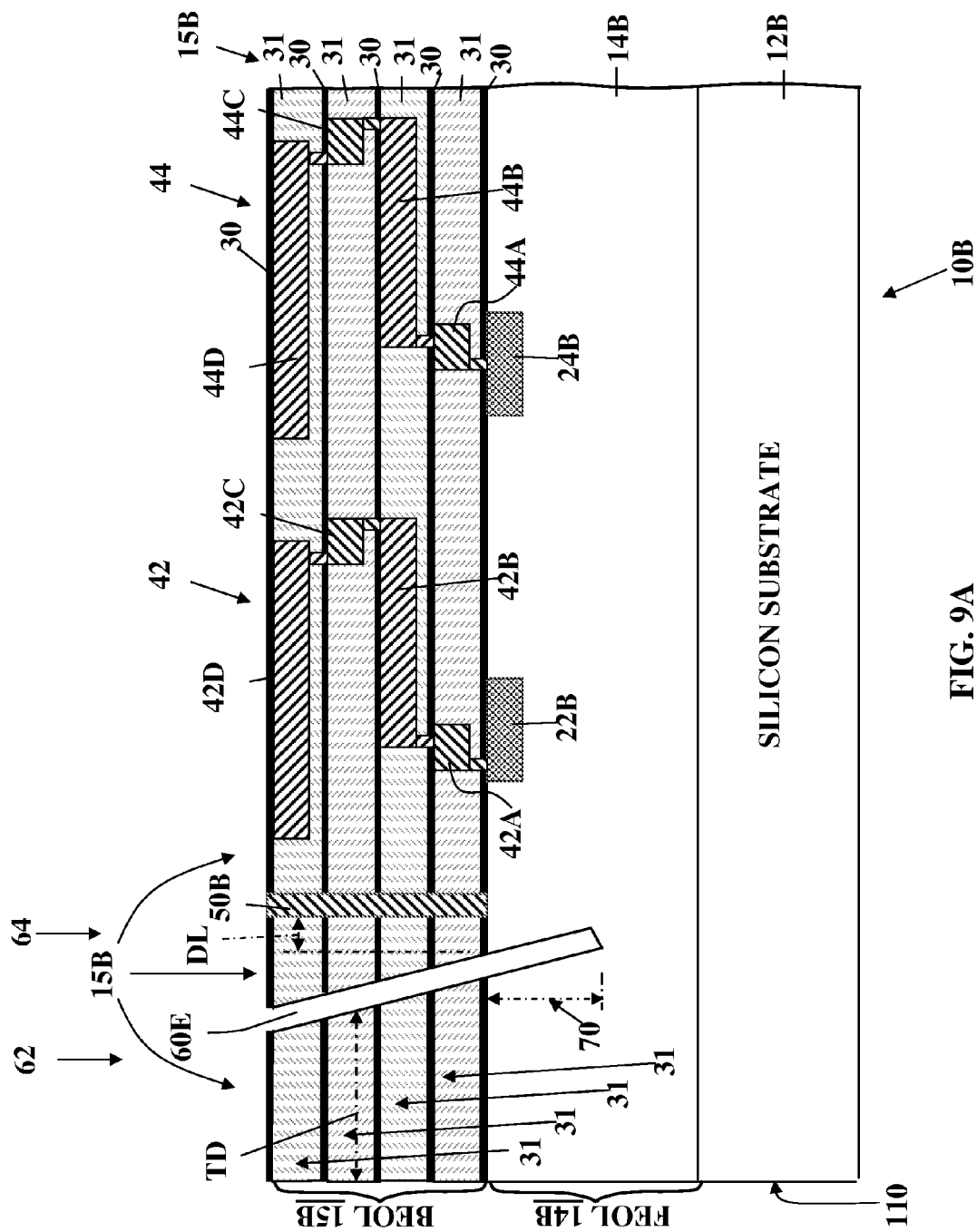
Figure 9B:
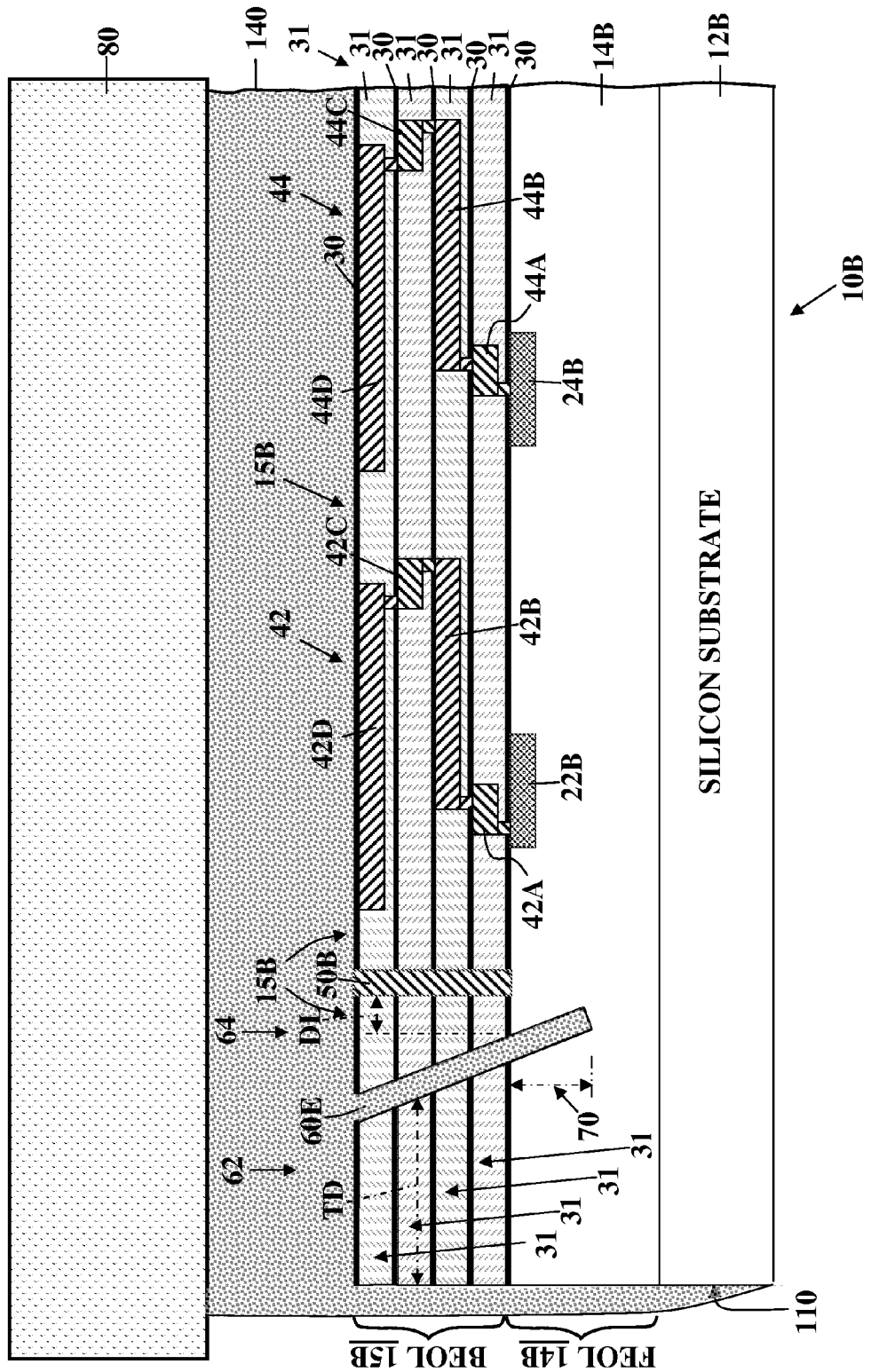

FIGS. 9A and 9B show an embodiment of the invention with a trench cut at an obtuse angle in the top surface of the substrate, providing a benefit similar that obtained with the embodiment of the invention shown in FIGS. 8A and 8B.

FIG. 10A is a process flow chart for the process of FIGS. 3A, 3B, and 3C.

FIG. 10B is a process flow chart for the process of FIGS. 3A, 3B', and 3C'.

FIG. 11 is a chart of Energy Release Rate vs. Delamination Length that shows that a second underfill UF2 has a lower energy release rate than a first underfill UF1.

DETAILED DESCRIPTION OF THE INVENTION

Figure 1A:
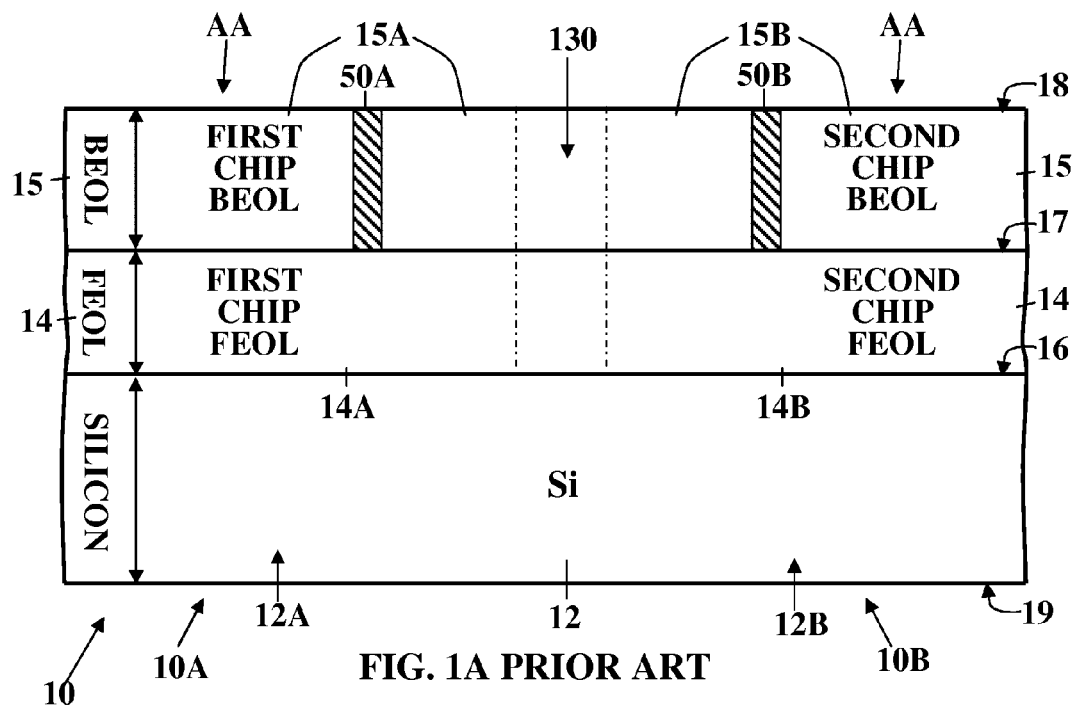
FIG. 1A a schematic, sectional, fragmentary view of a prior art CMOS FET semiconductor device, in an advanced stage of manufacture, shown formed in and upon the surface of a semiconductor substrate prior to the step of dicing.

FIG. 3A is an elevational sectional view taken along line 3A-3A' in FIG. 4 which shows a semiconductor device 10 comprising an embodiment of this invention which is a modification of the device 10 of FIG. 1A. For the most part, the semiconductor device 10 of FIG. 3A is identical to the device 10 of FIG. 1A with similar features being identified similarly by the same reference indicia with the same meanings. The device 10 includes the silicon semiconductor substrate 12, an active device FEOL region 14 containing structures, e.g. CMOS FET devices, portions of which are formed in the silicon semiconductor substrate 12, and portions of which are formed upon the top surface 16 thereof. The BEOL (interconnect) layer 15 is formed over the top surface 17 of the active device layer 14. The BEOL structure 15 comprises an interconnect structure comprising an Inter Level Dielectric (ILD) material and copper conductors embedded in the ILD material.

Figure 1B:
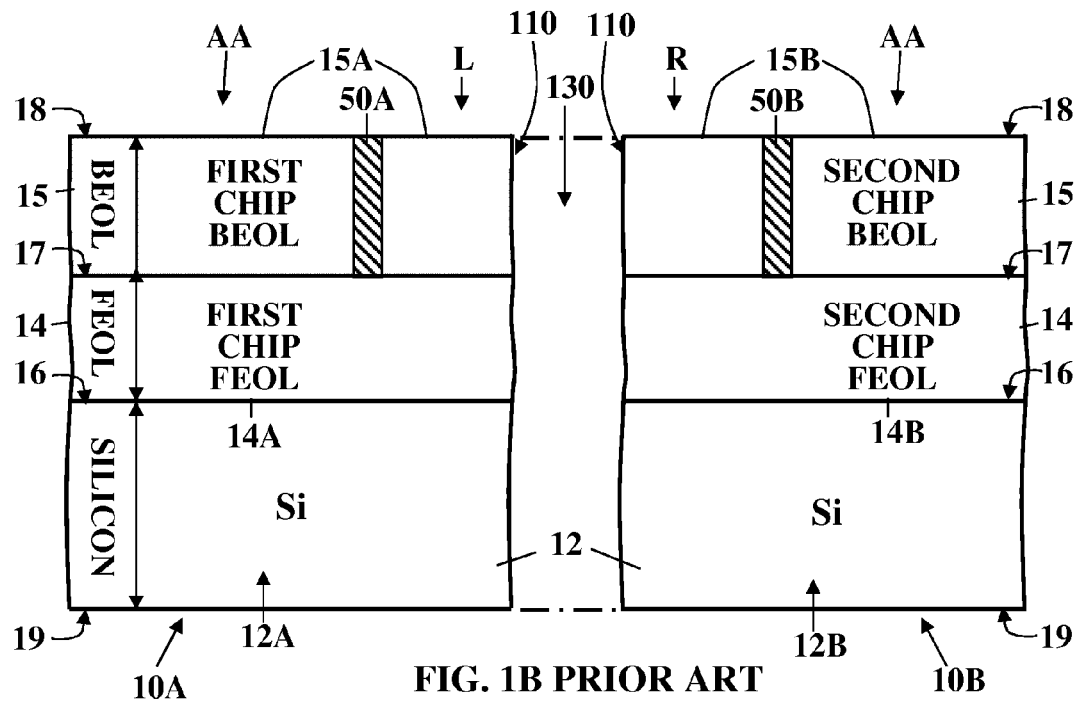
FIG. 1B depicts the prior art device of FIG. 1A after the dicing step which splits the device first and second chips by forming a dicing channel therein.
Figure 2A:
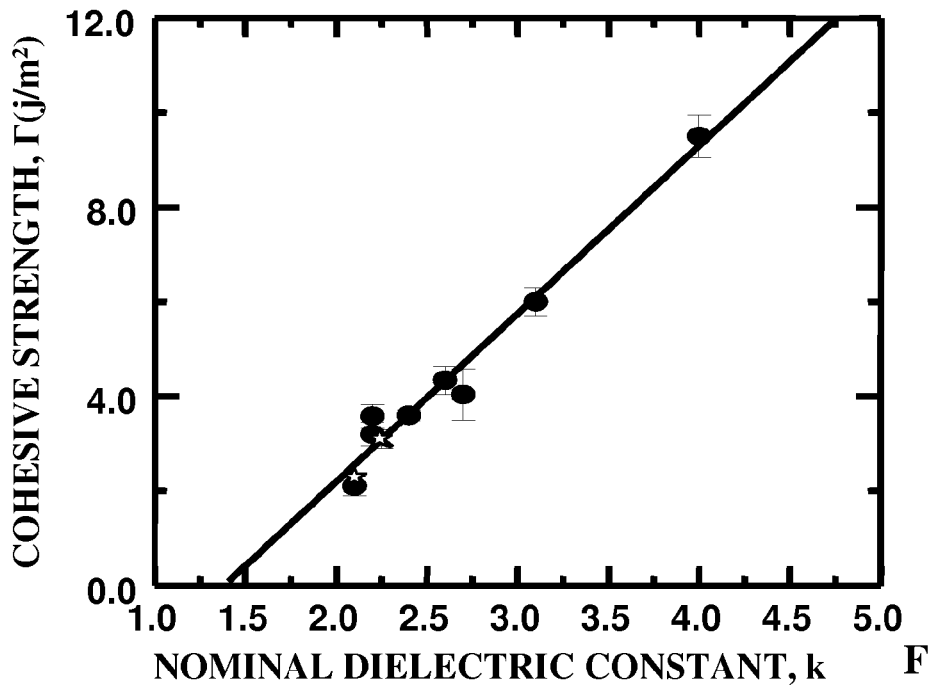
FIG. 2A is a chart which shows the decreasing of the cohesive strength of the ILD of a semiconductor chip as the dielectric constant decreases.
Figure 2B:
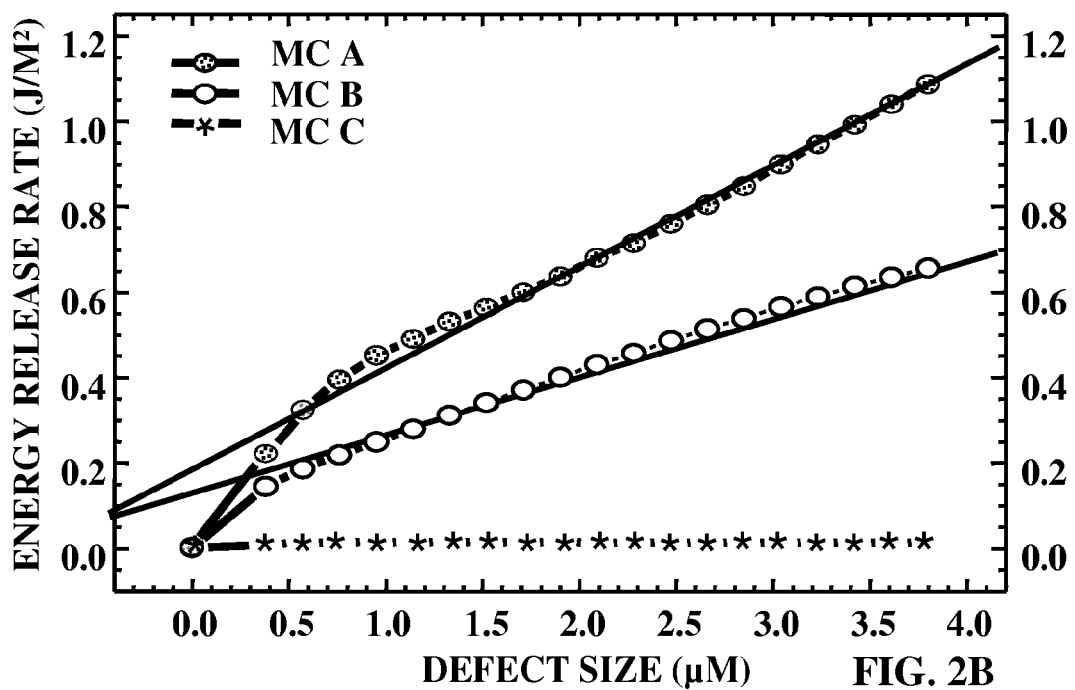
FIG. 2B is a chart which shows the energy imparted to dielectric layers due to the packaging material as a function of the defect size, i.e. length, of a flaw which is created during dicing and which propagates during reliability stressing.

However, in FIG. 3A the semiconductor device 10 is significantly different from the semiconductor device 10 of FIG. 1A because of the addition of the two Ultra Deep Isolation Trenches (UDITs) 60A/60B thereto in accordance with this invention, which extend down from the top surface of the semiconductor substrate 12 of the semiconductor device 10 and only partially through the semiconductor substrate 12. The UDIT 60A forms a frame which surrounds the crackstop barrier structure 50A as well as the active areas AA of the chip 10A. Similarly, the UDIT 60B forms a frame which surrounds the crackstop barrier structure 50B as well as the active areas AA of the chip 10B. The crackstop barrier structured 50A and 50B are located between the dicing channel 130 and the active area (AA) of each of the chips 12A/12B, respectively. As in FIGS. 1A and 1B, each of the crackstops 50A/50B extends entirely through the BEOL interconnect layer 15 to the top surface 17 of the active device FEOL region 14.

Referring again to FIG. 3A, it can be seen that the UDIT trenches 60A/60B extend down from the top surface 18 through the BEOL interconnect layer 15 and active device FEOL region 14 therebelow, down to a depth 70 below the top surface 16 of the silicon semiconductor substrate 12. Thus the UDIT trenches reach only partially down into the silicon semiconductor substrate 12, but to a significant depth therein below the top surface of the silicon semiconductor substrate 12. The UDIT trenches 60A/60B are deep and open to receive an underfill material therein to protect the first and second chips 10A/10B from subsequent damage.

The UDIT trenches 60A/60B can be formed by a subtractive process, e.g. saw cutting to form Saw Cut UDITs (SCUDITs), or laser scribing to form Laser Scribed UDITs (LSUDITs). Referring to FIG. 10A, the process of forming device 10 of FIG. 3A starts with step AA which leads to step AB. In step AB the active device FEOL region 14 is formed on the top surface 16 of the semiconductor substrate 12 of the semiconductor device 10. Step AC involves forming an interconnect structure 15 over the top surface 17 of the active device FEOL region 14 as is well understood by those skilled in the art. Both FIGS. 3A and 4 show a space 132 between the two crackstop barrier structures 50A/50B which frame the first and second chips 10A/10B.

In step AD in FIG. 10A, the UDITs 60A/60B are formed in semiconductor device 10 by saw cutting from the top surface 18 down through the interconnect structure 15 and the active device FEOL region 14 into the substrate 12 by one of several techniques. With saw cutting Saw Cut UDITs (SCUDITs) are formed. By employing laser scribing, Laser Scribed UDITs (LSUDITs) are created. Alternatively, any other subtractive process can be employed to form the UDIT trenches 60A/60B framing the crackstop barrier structures 50A/50B. The UDIT trenches 60A/60B are located between the dicing channel 130 and the frames provided by the crackstop barrier structures 50A/50B which also surround the active areas AA.

In other words, the crackstop barrier structures 50A/50B which frame and surround both of the active areas AA are framed and surrounded in turn by the UDIT trenches 60A/60B which in FIG. 3A are analogous to empty moats. The UDIT trenches 60A/60B are separated from the dicing channel 130 by the margin TD, i.e. the trenches 60A/60B are separated from where the diced edge of the chip may be by the margin TD. In the other direction towards the active areas AA, the UDIT trenches 60A/60B are separated from the crackstop barrier structures 50A/50B by the relatively narrow Delamination Length DL.

In FIGS. 3A/3B-9A/9B, the delamination length DL is the distance between the UDIT 60A/60B and the adjacent crackstop barrier structures 50A/50B. The greater the length DL, the greater is the amount of the energy released in the interconnect layer 15A/15B which tends to increase the probability of failures.

FIG. 3B shows the semiconductor device 10 of FIG. 3A after the step of dicing through the channel 130 in FIGS. 3A and 4 in accordance with step AE in FIG. 10A to separate the first chip 10A from the second chip 10B, prior to forming an underfill layer 140 shown in FIG. 3C. The dicing process also separates the remainder of the chips not shown in FIG. 3A from each other. As in FIG. 1B, chip edge surfaces 110 are formed approximately along the vertical edges of the chip-to-chip dicing channel 130 where material has been removed. The first chip 10A includes the interconnect layer 15A, the active device layer 14A and the semiconductor substrate 12A including the active devices of the first chip 10A therein. The second chip 10B includes the interconnect layer 15B, the active device layer 14B and the semiconductor substrate 12B including the active devices of the second chip 10B therein.

In FIG. 3C the diced chips 10A/10B of FIG. 3B are shown after deposition thereover of a blanket underfill layer 140, in accordance with step AF in FIG. 10. The blanket underfill layer 140, which is formed to protect the diced chips 10A/10BA, covers the top surfaces 18 of both of the chips 10A/10B and is shown filling the UDITs 60A/60B completely. As shown in FIG. 3C, the blanket underfill layer 140 covers the chips 10A/10B completely thereby providing a protective coating covering the previously exposed top surfaces 18 and the chip edge surfaces 110 of chips 10A/10B on the sidewalls thereof. In other words, the blanket underfill layer 140 reaches down to fill the UDIT trenches 60A/60B and covers the diced chip edge surfaces 110 on the sidewalls of the diced chips 10A/10B.

Alternative Process

An alternative to the process of FIGS. 3B and 3C is illustrated by both FIG. 3B' and FIG. 3C' with reference to the flow chart in FIG. 10B wherein steps AA-AD are identical to those of FIG. 10A.

In FIG. 3B', in accordance with step AE' in FIG. 10B the semiconductor device 10 of FIG. 3A of step AD has been coated with a blanket underfill layer 140 prior to the step of dicing step. In this case the device 10 is completely covered with a blanket underfill layer 140 prior to the dicing step. Note that as with FIG. 3C, the underfill layer 140 covers the top surface 18 of the BEOL structure 15 of semiconductor device 10 and completely fills the UDIT trenches 60A/60B, but of course it does not cover the sidewalls 110 (i.e. soon to be formed sidewalls of the diced chips 10A/10B, which have not yet been formed at this stage of the process of FIG. 10B). Nevertheless, at the end of step AE', the blanket underfill layer 140 covers the top surfaces 18 of the BEOL structure 15 and completely fills the UDIT trenches 60A/60B.

Then referring to FIG. 3C', the device of 3B' is shown (as with FIG. 3B) with the chips 10A/10B separated by dicing with the diced chip edges 110, i.e. sidewalls, formed along the dicing channel 130 where material was removed in accordance with step AF' in FIG. 10B. The first chip 10A includes the interconnect layer 15A, the active device layer 14A and the semiconductor substrate 12A including active devices therein. The second chip 10B includes the BEOL structure 15B, the active device layer 14B and the semiconductor substrate 12B including active devices therein. As with FIG. 3C, the underfill layer 140, which covers the top surface of the semiconductor device 10 and fills all of the UDIT trenches remains in place including completely covering the top surfaces 18 of the BEOL structures 15A/15B of the chips 10A/10B and completely filling the UDITs 60A/60B, but leaving the diced chip edges 110 (sidewalls) of the diced chips 10A/10B uncovered.

FIG. 4 shows a plan view of a semiconductor device 10 of FIG. 3A prior to dicing and formation of the underfill layer 140 including the first chip 10A and the second chip 10B. A preferred embodiment of the chip edge in accordance with this invention is shown in FIG. 4.

First Preferred Embodiment

FIG. 5A is a sectional elevation, taken along line 5A-5A' in FIG. 4, which shows an enlarged view of the second chip 10B after forming the UDIT 60B located between the edges 110 and the crackstops 50B; and after performing the dicing step in accordance with the process steps of FIG. 10A; but prior to forming an underfill layer 140. As is conventional, the silicon substrate 12B of the second chip 10B is lightly doped. A first FET 22B and a second FET 24B are shown schematically formed in the top surface of the active device layer 14B of the second chip 10B. There are metal interconnects (preferably copper conductors) in the form of horizontally extending metal lines 44 within several stacked dielectric layers 30 in the BEOL structure 15B. As will be well understood by those skilled in the art, the metal interconnects are connected together by the vertically extending metal vias 45. External connections are provided to the FET 22B by the combination of the metal interconnects 42A-42D and the intermediate metal vias 45 which provide connections between the metal interconnect lines. Similarly, external connections are provided to the FET 24B by the metal interconnect lines 44A-44D and the associated intermediate metal vias 45, as will be well understood by those skilled in the art.

The capping layers 30 are formed of a hard mask material such as N-BLoK. The low-k dielectric layer 31 comprises pSiCOH (porous SiCOH.) An NBloK/pSiCOH interface 30/31 is created when a hard mask layer 30 is deposited onto a previously deposited dielectric layer 31 containing lower level metal lines 42/44 and the vias 45. An N-BLoK capping layer 30 is formed on the top surface of the FEOL region 14B and on top of each dielectric layer 31. Dielectric layer 31 contains metal lines 42/44 and so an N-BloK/pSiCOH interface 30/31 is formed when each capping layer 30 is deposited on an underlying dielectric layer 31. The pSiCOH/N-BloK 31/30 interface is created when pSiCOH is deposited on top of N-BloK. The interface has lower toughness than N-BloK/pSiCOH 30/31 interface, and the adhesion is shown in FIG. 11 as line 143.

Referring again to FIG. 5A, as indicated above, the BEOL structure 15B of the second chip 10B consists of a stack of a plurality of ILD dielectric layers 31 composed of a low-k dielectric material such as pSICOH separated by cap layers 30 composed of a material such as NBLoK. On the left, a crackstop/MOB 50B is shown between the first FET 22B on the right and the UDIT trench 60B on the left. The plurality of different ILD layers 30 in the BEOL structure 15B may have a plurality of different dielectric constants but should consist of at least one dielectric layer with a bulk dielectric constant (k) less than approximately 3.3.

In summary, the embodiment of FIG. 5A consists of the substrate 12B, the FEOL region 14B and the BEOL structure 15B, the crackstop/MOB 50B, and the UDIT trench 60B surrounding and proximate to the crackstop/MOB 50B. The FEOL region includes portions of the active FET devices 22B/24B. The BEOL structure includes the multilayer ILD stack 15B, the metal vias 45 and the metal interconnects 42A-42D, 44A-44D. In FIG. 5A, on the left of the semiconductor device 10B, there is an outer margin 62 with the width TD outside of the trench 60B on the right and the diced chip edge 110 on the left.

Important parameters relative to prevention of damage due to cracks in the semiconductor device 10B are the delamination length DL comprising the inner margin 64 between the crackstop/MOB 50B and the UDIT trench 60B and the distance TD (which spans the outer margin 62) from the UDIT trench 60B to the diced chip edge 110. The outer margin 62 extends from the outside of the UDIT trench 60B and the proximate chip edge 110. The trench of the UDIT trench 60B reaches down through the ILD layers 30A-30D to a depth 70 below the top surface of the FEOL region 14B of the substrate 12B to provide enhanced protection of the chip 10B from damage caused by cracking.

The trench region 60B, which is next to the crackstop/MOB 50B, has a width of between about 1 μm to about 80 μm, which may be created by a laser scribe, a mechanical saw, or any such other suitable cutting methods so as to give the structure shown in FIG. 4. The depth 70 of the UDIT trench below the top surface of the BEOL region 14B of the substrate is preferably from about 1 μm to about 200 μm and may be optimized for reliability. The distance comprising the Delamination Length DL between the crackstop/MOB 50B and the UDIT trench 60B is preferably within the range from about 0 μm to about 40 μm. The distance TD from the outer edge of UDIT trench 60B to the diced edge 110 is within the range between about 0 μm and about 200 μm.

FIG. 5B shows the second chip 10B (FIG. 5A) after depositing the underfill layer 140 covering the semiconductor device 10B and joining the device to a package 80. The underfill layer 140 covers the top surface of the ILD stack 30 of the interconnect 15B and completely fills the UDIT trench 60B as well as covering the chip edge 110, reaching around the outer margin 62 to protect the chip 10B by inhibiting damage from dicing and chip packaging interaction failures in the interconnect structure 15B among other portions of the chip 10B. After formation of the underfill layer 140, the package 80 is bonded to the chip 10 in a conventional manner by C4 bonds or the like obscured by the underfill 140.

The underfill layer 140 may be composed of a material such as either UF1 or UF2. Both UF1 and UF2 materials are underfill compounds with each having a different modulus and a different CTE value; but UF1 is the preferred underfill material. Referring to FIG. 11, while UF2 has a lower energy release rate (curve 142) than UF1 (curve 141), UF2 is unsatisfactory because it is prone to cause delamination due to C4 fatigue in interconnect structures. The UF materials are organic polymers filled with silica beads and both UF1 and UF2 have approximately the same percentage of silica filler. Line 143 represents the adhesion at the interface between the low-k dielectric layer 31 and cap layer 30, where the low-k dielectric is pSiCOH in FIGS. 5A/5B and FIG. 11.

TABLE I

| Material Properties of Underfill Materials UF1 and UF2 | | | |
|---|---|---|---|
| Material | Glass Transition Temperature (Tg) | CTE Below Tg (ppm/C.) | Modulus Below Tg (GPa) |
| UF1 | 94° C. | 28 | 10 |
| UF2 | 60° C. | 35 | 8 |

Second Preferred Embodiment

FIG. 5B shows the second chip 10B (FIG. 5A) after performing process steps in accordance with FIG. 10A; with the dicing step followed by depositing the underfill layer 140 completely covering the semiconductor device 10B and joining the device to a package 80. The underfill layer 140 completely covers the top surface of the ILD stack 30 of the interconnect 15B and completely fills the UDIT trench 60B as well as covering the chip edge 110, reaching around the outer margin 62 to protect the chip 10B by inhibiting damage from dicing and chip packaging interaction failures in the interconnect structure 15B among other portions of the chip 10B. After formation of the underfill layer 140, the package 80 is bonded to the chip 10 in a conventional manner by C4 bonds or the like obscured by the underfill 140.

FIG. 6B shows the semiconductor device 10B of FIG. 6A after deposition of the underfill layer 140 and after joining the device to a package 80. The underlayer 140 completely covers the top surface of the BEOL structure 15B and completely fills the UDIT trench 60B', covering the exposed surface of the semiconductor substrate 12B in the outer margin 62, as well as covering the chip edge 110, reaching around the outer margin 62 to protect the chip 10B by inhibiting damage from dicing and chip packaging interaction failures in the interconnect structure 15B among other portions of the chip 10B. After formation of the underfill layer 140, the package 80 is bonded to the chip 10 in a conventional manner by C4 bonds or the like obscured by the underfill 140.

Third Preferred Embodiment

FIGS. 7A, 7B and 7C show sectional views of a modification of the semiconductor device 10B of FIG. 5A in which a plurality of parallel UDIT trenches 60B, 61B and 62B have been formed, between the barrier structure 50B and the chip edge 110. FIG. 7B shows the semiconductor device 10B of FIG. 7A after deposition of the underfill layer 140, completely covering the top surface of the BEOL 15B filling the parallel UDIT trenches 60B, 61B and 62B and after joining the device to a package 80. In the plan view of FIG. 7C, the narrow UDIT trenches 60B, 61B and 62B (which are of equal depth) surrounding the barrier structure 50B and the inner UDIT trenches have successively larger dimensions of length and width as shown in the plan view of FIG. 7C with widths as described above and where the area outside each trench may be intact or removed by previously described processes. An additional benefit of the chip edge in accordance with this invention may be realized once the chip is packaged which typically entails covering the chip with a molding compound (for a wirebond type application) or an underfill (for a C4 type application). In the embodiment of FIGS. 7A-7C, the molding compound or the underfill layer 140 fills the trenches 60B, 61B, and 62B, as shown in FIG. 7B. The molding compound or underfill layer 140 provides a mechanical interlock between the chip 10B and the package and reduces the effective stress on the dielectric materials. After formation of the underfill layer 140, the package 80 is bonded to the chip 10 in a conventional manner by C4 bonds or the like obscured by the underfill 140.

Fourth Preferred Embodiment

FIGS. 8A and 8B show a further modification of the embodiment of the invention shown in FIGS. 5A and 5B. This embodiment is particularly applicable to dicing procedures that are performed by a laser. One potential application that would lead to the structure in FIGS. 8A and 8B is to create a trench through either saw or laser dicing and then make a second pass along the trench 60D with a laser. In FIGS. 8A and 8B, the second pass through the trench with the laser is identified by the additional feature where the trench 60D is expanded, i.e. flared out, to form a trough 120 at the bottom of the trench 60D wider than the width of the portion of the trench 60D thereabove. FIG. 8B shows the semiconductor device 10B of FIG. 8A after deposition of the underfill layer 140 completely covering the top surface of the BEOL 15B filling the parallel UDIT trench 60D as well as its trough 120 and after joining the device to a package 80. There is a rounded cross section at the bottom of the trench 60D which is also filled with underfill or molding compound during packaging as shown in FIG. 8B. After formation of the underfill layer 140, the package 80 is bonded to the chip 10 in a conventional manner by C4 bonds or the like obscured by the underfill 140.

Fifth Preferred Embodiment

FIGS. 9A and 9B show an embodiment of the invention providing a benefit similar to that obtained with the embodiment of the invention shown in FIGS. 8A and 8B. FIG. 9B shows the semiconductor device 10B of FIG. 9A after deposition of the underfill layer 140 completely covering the top surface of the BEOL 15B filling its angled UDIT trench 60E and after joining the device to a package 80. In FIGS. 9A and 9B UDIT trench 60E is cut slanted at an obtuse angle with respect to the top surface of the semiconductor substrate 12B and undercutting substrate 12B, either by tilting the cutting device (laser or saw blade not shown) or the semiconductor substrate 12B or both.

The foregoing description discloses only exemplary embodiments of the invention. Modifications of the above disclosed apparatus and methods which fall within the scope of the invention will be readily apparent to those of ordinary skill in the art. While this invention has been described in terms of the above specific exemplary embodiment(s), those skilled in the art will recognize that the invention can be practiced with modifications within the spirit and scope of the appended claims, i.e. changes can be made in form and detail, without departing from the spirit and scope of the invention. Accordingly, while the present invention has been disclosed in connection with exemplary embodiments thereof, it should be understood that changes can be made to provide other embodiments which may fall within the spirit and scope of the invention and all such changes come within the purview of the present invention and the invention encompasses the subject matter defined by the following claims.

What is claimed is:

1. A semiconductor product comprising:
a semiconductor substrate having a top surface and a bottom surface;
a semiconductor chip with an active device layer, and with an interconnection layer formed above both said active device layer and said substrate;
said semiconductor product having an upper surface and a perimeter;
a crack stop barrier formed in said chip within said perimeter; and
a trench cut extending down through said interconnection layer and said upper surface of said semiconductor product, but extending only partially down into said active device layer or only partially through said top surface into said substrate between said perimeter and said crack stop barrier.

2. The semiconductor product of claim 1 comprising:
a semiconductor device formed in said active device layer of said product; and
said interconnection layer containing dielectric layers, interconnect lines and vias.

3. The semiconductor product of claim 2 wherein an underfill layer is formed over said product covering said interconnection layer and filling said trench.

4. The semiconductor product of claim 2 wherein said interconnection structure includes a low-k dielectric material.

5. The semiconductor product of claim 2 wherein:
said barrier extends through said interconnection layer at least into contact with said semiconductor substrate; and
said trench extends at least partially through said semiconductor layer.

6. The semiconductor product of claim 5 wherein an underfill layer is formed over said product covering said interconnection structure and filling said trench.

7. The semiconductor product of claim 6 wherein said low-k dielectric material comprises porous hydrogenated silicon oxycarbide (pSiCOH.).

8. The semiconductor product of claim 2 wherein said interconnection structure is recessed down to said substrate outboard from said trench.

9. The semiconductor product of claim 8 wherein said trench has a bottom which is flared outwardly.

10. The semiconductor product of claim 1 wherein:
said trench is spaced laterally with respect to said top surface of said substrate; and
said trench extends through and into said top surface of said substrate and is spaced from said diced edge of said chip.

11. The semiconductor product of claim 1 wherein a plurality of trenches are formed nested one inside another in a sequence of trenches of increasing lateral dimensions are formed cut into said top surface of said semiconductor chip surrounding said barrier, between said perimeter and said barrier.

12. The semiconductor product of claim 11 wherein said interconnection structure is recessed down to said substrate outboard from said trench.

13. The semiconductor product of claim 1 wherein said trench is slanted at an angle with respect to said top surface.

14. The semiconductor product of claim 1 comprising:
said interconnection layer containing dielectric layers, interconnect lines and vias;
said interconnection structure including a low-k dielectric material; and
said low-k dielectric material comprising porous hydrogenated silicon oxycarbide (pSiCOH.).

15. A semiconductor product comprising:
a semiconductor substrate having a top surface and a bottom surface
a semiconductor chip formed including said substrate,
said semiconductor chip having a Front End Of Line (FEOL) layer with an upper surface formed above said top surface and having a Back End Of Line (BEOL) layer including therein an interconnection structure formed above said upper surface;
said semiconductor chip and said interconnection structure having a perimeter;
a barrier edge selected from the group consisting of a crackstop barrier and a perimeter with a diced edge on said perimeter; and
a trench cut into said semiconductor chip between said diced edge and said barrier edge.

16. The semiconductor product of claim 15 comprising:
a semiconductor device formed in said chip; and
said interconnection layer containing dielectric layers, interconnect lines and vias.

17. The semiconductor product of claim 16 wherein:
an underfill layer is formed over said product covering said interconnection structure and filling said trench;
said interconnection structure includes a low-k dielectric material.

18. The semiconductor product of claim 17 wherein:
said barrier extends through said interconnection structure at least into contact with said semiconductor substrate; and
said trench extends at least partially through said semiconductor layer.

19. The semiconductor product of claim 16 wherein an underfill layer is formed over said product covering said interconnection structure and filling said trench.

20. A semiconductor product comprising:
said semiconductor product having a top surface and a bottom surface including a semiconductor chip;
said semiconductor product having an upper surface and a perimeter, with a crack stop barrier formed in said chip within said perimeter, and with an active device Front End Of Line (FEOL) layer and a Back End Of Line (BEOL) layer above said FEOL layer with said BEOL layer including an interconnection structure with said FEOL and BEOL layers formed above said top surface of said substrate;
a barrier formed in said chip within said perimeter;
a trench cut extending down through said upper surface of said semiconductor product between said perimeter and said barrier but extending only partially down into said active device FEOL layer or said substrate between said crack stop barrier and the outermost of said perimeter; and
a blanket underfill layer over said product completely covering said interconnection structure and completely filling said trench.

* * * * *